US009860516B2

(12) United States Patent
Shibazaki et al.

(10) Patent No.: US 9,860,516 B2
(45) Date of Patent: Jan. 2, 2018

(54) IMAGE PROCESSING APPARATUS, IMAGE PROCESSING METHOD AND RECORDING MEDIUM

(71) Applicant: NIKON CORPORATION, Tokyo (JP)

(72) Inventors: Kiyoshige Shibazaki, Higashimurayama (JP); Susumu Mori, Tokyo (JP); Muneki Hamashima, Fukaya (JP)

(73) Assignee: NIKON CORPORATION, Tokyo (JP)

( * ) Notice: Subject to any disclaimer, the term of this patent is extended or adjusted under 35 U.S.C. 154(b) by 498 days.

(21) Appl. No.: 14/085,322

(22) Filed: Nov. 20, 2013

(65) Prior Publication Data

US 2014/0184755 A1 Jul. 3, 2014

Related U.S. Application Data

(63) Continuation of application No. PCT/JP2012/003565, filed on May 30, 2012.

(30) Foreign Application Priority Data

May 30, 2011 (JP) ................................. 2011-120302

(51) Int. Cl.
*H04N 13/02* (2006.01)
*H01L 27/146* (2006.01)
(Continued)

(52) U.S. Cl.
CPC ..... *H04N 13/021* (2013.01); *H01L 27/14621* (2013.01); *H01L 27/14627* (2013.01);
(Continued)

(58) Field of Classification Search
CPC ........ H01L 27/14621; H01L 27/14627; H04N 13/021; H04N 13/0257; H04N 5/3696; H04N 9/045
See application file for complete search history.

(56) References Cited

U.S. PATENT DOCUMENTS 6,512,838 B1* 1/2003 Rafii ........................ G01C 3/08
348/E3.018
7,333,678 B1* 2/2008 Huang .................. H04N 9/045
348/272
(Continued)

FOREIGN PATENT DOCUMENTS

CN          103229498 A      7/2013
JP          A-08-047001      2/1996
(Continued)

OTHER PUBLICATIONS

International Search Report issued in Application No. PCT/JP2012/003565; dated Aug. 31, 2012 (With Translation).
(Continued)

*Primary Examiner* — Mohammed Rahaman
(74) *Attorney, Agent, or Firm* — Oliff PLC

(57) ABSTRACT

So as to obtain color parallax images, it has been necessary to prepare an image capturing optical system and an image capturing element that are complex, to capture the parallax images. In view of this, provided is an image processing apparatus including: an image obtaining section that obtains original image data including a pixel having a pixel value of any of primary colors constituting colors of a subject image and a pixel having a pixel value showing at least a parallax of the subject image; and an image generating section that generates, from the original image data, primary color image data made up of pixels having the pixel value of the primary color, and parallax image data made up of pixels having the pixel value showing the parallax.

21 Claims, 22 Drawing Sheets

(51) Int. Cl.
    *H04N 9/04*        (2006.01)
    *H04N 5/369*       (2011.01)
(52) U.S. Cl.
    CPC ........... *H04N 5/3696* (2013.01); *H04N 9/045*
                         (2013.01); *H04N 13/0257* (2013.01)

(56)            References Cited

U.S. PATENT DOCUMENTS

| 2009/0128658 | A1* | 5/2009 | Hayasaka | .............. H04N 5/225 |
| | | | | 348/222.1 |
| 2009/0140122 | A1 | 6/2009 | Suzuki | |
| 2009/0290198 | A1* | 11/2009 | Hamano | ................ G02B 5/205 |
| | | | | 358/475 |
| 2010/0066868 | A1 | 3/2010 | Shohara | |
| 2010/0283863 | A1 | 11/2010 | Yamamoto | |
| 2011/0285910 | A1* | 11/2011 | Bamji | .................... G01S 17/89 |
| | | | | 348/631 |
| 2012/0140100 | A1 | 6/2012 | Shibazaki et al. | |
| 2012/0193515 | A1* | 8/2012 | Agranov | ................ G01S 3/782 |
| | | | | 250/208.1 |
| 2012/0257089 | A1 | 10/2012 | Shohara | |

FOREIGN PATENT DOCUMENTS

| JP | 2003-007994 A | 1/2003 |
| JP | 2009-081493 A | 4/2009 |
| JP | 2009-124213 A | 6/2009 |
| JP | 2010-092461 A | 4/2010 |
| JP | 2010-263572 A | 11/2010 |

OTHER PUBLICATIONS

Apr. 7, 2015 Office Action issued in Japanese Patent Application No. 2013-517884.
Apr. 1, 2015 Office Action issued in Chinese Patent Application No. 201280034591.3.

* cited by examiner

⟨1⟩rF=2

| REPETITIVE PATTERN CLASSIFICATION | | EXISTENCE/NON-EXISTENCE OF PARALLAX PIXEL | | | PARALLAX PIXEL | PARALLAX ARRAY | CHARACTERISTICS |
|---|---|---|---|---|---|---|---|
| | | Gr | Gb | R, B | | | |
| CLASSIFICATION A | A-1 | EXIST | EXIST | NOT EXIST | Gr AND Gb ALTERNATE | Gr ROW Gr, Gb ROW Gb | THE IMAGE QUALITY OF 2D IMAGE CAN BE MAINTAINED TO SOME EXTENT, WHILE OBTAINING 3D IMAGE |
| | A-2 | | | | | Gr COLUMN Gr, Gb COLUMN Gb | |
| CLASSIFICATION B | B-1 | EXIST | NOT EXIST | NOT EXIST | ONLY ONE PIXEL OF Gr (OR Gb) | Gr ROW Gr | HIGH RESOLUTION IS MAINTAINED IN 2D IMAGE, WHILE OBTAINING 3D IMAGE |
| | B-2 | (NOT EXIST) | (EXIST) | | | Gb COLUMN Gb (OR Gr COLUMN Gr) | |
| CLASSIFICATION C | C-1 | EXIST | EXIST | NOT EXIST | EACH TWO PIXELS OF Gr, Gb | Gr ROW Gr, Gb ROW Gb | OBTAINING 3D COLOR IMAGE HAVING FAIRLY HIGH RESOLUTION AND 2D IMAGE WITH SOMEWHAT LOW RESOLUTION |
| | C-2 | | | | | Gr COLUMN Gr, Gb COLUMN Gb | |
| CLASSIFICATION D | D-1 | EXIST | NOT EXIST | EXIST | EACH THREE PIXELS OF Gr, R, B | Gr ROW Gr, R, Gb ROW B | OBTAINING 3D COLOR IMAGE WITH SUFFICIENT IMAGE QUALITY WHILE ALSO OBTAINING INFORMATION ON 2D IMAGE |
| | D-2 | | | | | Gr COLUMN Rr, Gb COLUMN B | |
| CLASSIFICATION E | E-1 | EXIST | EXIST | EXIST | EACH FOUR PIXELS OF Gr, Gb, R, B | Gr ROW Gr, R, Gb ROW B, Gb | OBTAINING 3D COLOR IMAGE HAVING THE HIGHEST QUALITY WITH REDUCED RESOLUTION |
| | E-2 | | | | | Gr COLUMN R, Gr Gb COLUMN Gb, B | |

FIG. 10

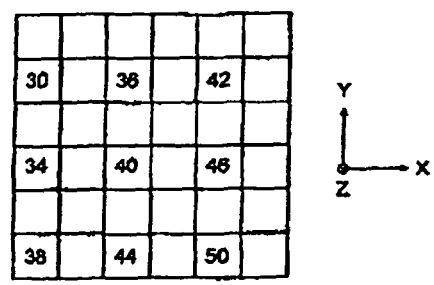
RO IMAGE DATA
| 30 | 33 | 36 | 39 | 42 | 42 |
|----|----|----|----|----|----|
| 30 | 33 | 36 | 39 | 42 | 42 |
| 32 | 35 | 38 | 41 | 44 | 44 |
| 34 | 37 | 40 | 43 | 46 | 46 |
| 36 | 39 | 42 | 45 | 48 | 48 |
| 38 | 41 | 44 | 47 | 50 | 50 |
RN IMAGE DATA
FIG. 18

IMAGE PROCESSING APPARATUS, IMAGE PROCESSING METHOD AND RECORDING MEDIUM

TECHNICAL FIELD

The present invention relates to an image processing apparatus, an image processing method, and a recording medium.

RELATED ART

As is described in Japanese Patent Application Publication No. H8-47001, a stereo image capturing apparatus capturing a stereo image made of a right-eye image and a left-eye image using two image-capturing optical systems has been known. Such a stereo image capturing apparatus generates parallax between two images by capturing images of the same subject using two image-capturing optical systems arranged with a certain interval therebetweeen.

SUMMARY

So as to obtain color parallax images, it has been necessary to prepare an image capturing optical system and an image capturing element that are complex, to capture the parallax images.

Therefore, it is an object of an aspect of the innovations herein to provide an image processing apparatus, an image processing method, and a recording medium, which are capable of overcoming the above drawbacks accompanying the related art. The above and other objects can be achieved by combinations described in the claims.

According to a first aspect of the innovations herein, provided is an image processing apparatus including: an image obtaining section that obtains original image data including a pixel having a pixel value of any of primary colors constituting colors of a subject image and a pixel having a pixel value showing at least a parallax of the subject image; and an image generating section that generates, from the original image data, primary color image data made up of pixels having the pixel value of the primary color, and parallax image data made up of pixels having the pixel value showing the parallax.

According to a second aspect of the innovations herein, provided is an image processing method including obtaining original image data including a pixel having a pixel value of any of primary colors constituting colors of a subject image and a pixel having a pixel value showing at least a parallax of the subject image; and generating, from the original image data, primary color image data made up of pixels having the pixel value of the primary color, and parallax image data made up of pixels having the pixel value showing the parallax.

According to a third aspect of the innovations herein, provided is a recording medium storing therein a program for causing a computer to: obtain original image data including a pixel having a pixel value of any of primary colors constituting colors of a subject image and a pixel having a pixel value showing at least a parallax of the subject image; and generate, from the original image data, primary color image data made up of pixels having the pixel value of the primary color, and parallax image data made up of pixels having the pixel value showing the parallax.

The summary clause does not necessarily describe all necessary features of the embodiments of the present invention, and the present invention may also be a sub-combination of the features described above.

BRIEF DESCRIPTION OF THE DRAWINGS

FIG. 10 explains various examples in which parallax pixels are allocated to a Bayer array when there are two kinds of parallax pixels.

FIG. 18 shows an example of interpolation of pixel values in Step S14.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

A digital camera according to the present embodiment, which is one embodiment of an image capturing apparatus, is configured to generate images corresponding to a plurality of view points at one time and store them as an image data set. Images taken from different view points are referred to as "parallax image."

Figure 1:
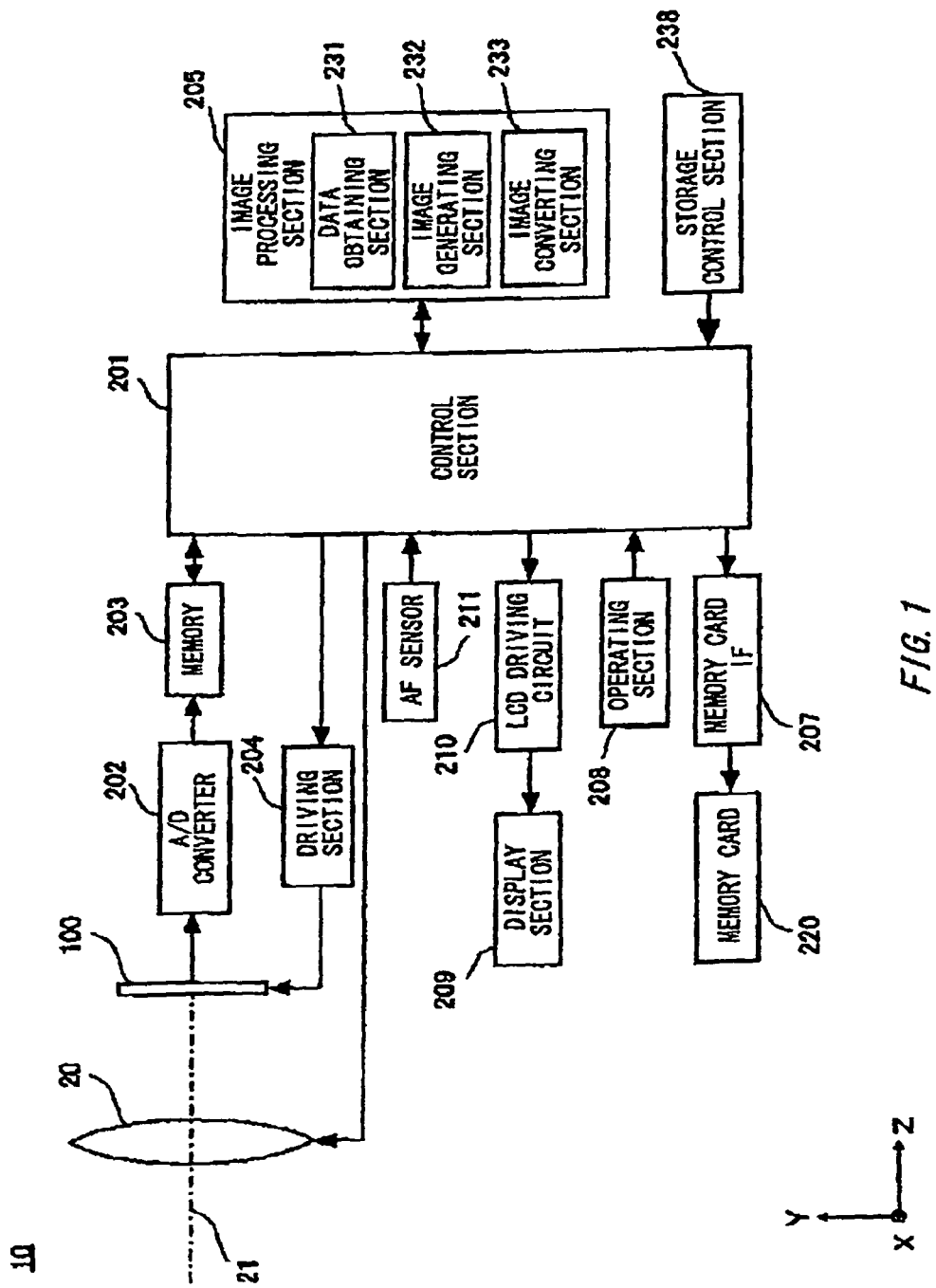
FIG. 1 is a diagram showing the configuration of a digital camera according to an embodiment of the present invention.

FIG. 1 is a diagram showing the configuration of a digital camera 10 according to an embodiment of the present invention. The digital camera 10 includes an image capturing lens 20 which is an image capturing optical system, and guides a subject light flux incident along the optical axis 21 towards the image-capturing element 100. The image capturing glens 20 may alternatively a lens unit detacheable with respect to the digital camera 10. The digital camera 10 includes an image-capturing element 100, a control section 201, an A/D converter 202 a memory 203, a driving section 204, an image processing section 205, a memory card IF 207, an operating section 208, a display section 209, an LCD driving circuit 210, an AF sensor 211, and a storage control section 238.

Note that as shown in this drawing, the direction parallel to the optical axis 21 towards the image-capturing element 100 is determined as +z-axis plus direction, and the direction towards the front side of the paper in which the drawing is drawn on the plane orthogonal to the z-axis is defined as the +x-axis plus direction, and the upper direction of the paper is determined as the +y-axis plus direction. The X axis corresponds to the horizontal direction in the composition taken at the time of image taking, and likewise, the Y axis corresponds to the vertical direction. In some of the drawings that follow, the coordinates axes are shown to clarify the orientations of the drawings with reference to the coordinates axis of FIG. 1.

The image-capturing lens 20 is made up of a plurality of optical lens groups, and forms an image of the subject light flux, in the vicinity of the focus plane. Note that the image-capturing lens 20 in FIG. 1 is represented by a virtual single lens provided in the vicinity of the pupil. The image-capturing element 100 is provided in the vicinity of the focus plane of the image-capturing lens 20. The image-capturing element 100 is an image sensor (e.g., CCD, CMOS sensor) in which a plurality of photoelectric conversion elements are arranged two dimensionally. The driving section 204 controls the timing of the image capturing element 100 at which the image capturing element 100 converts a subject image formed on the light receiving plane and outputs it to the A/D converter 202.

The A/D converter 202 converts the image signal outputted from the image capturing element 100 into a digital signal, and outputs it as RAW original image data to a memory 203. The image processing section 205 performs various types of image processing using the memory 203 as a workspace, thereby generating image data. In particular, the image processing section 205 includes a data obtaining section 231 that obtains the RAW original image data from the A/D converter 202, an image generating section 232 that generates RAW primary color image data and RAW parallax image data from the RAW original image data, and an image converting section 233 that converts the RAW primary color image data and the RAW parallax image data to RAW parallax primary-color colored image data or the like. Each processing is detailed later.

The image processing section 205 also conducts general image processing functions such as adjusting the image data according to the selected image format. The generated image data can be converted to a display signal by the LCD driving circuit 210, and displayed to the display section 209. The generated image data can also be recorded in the memory card 220 mounted to the memory card IF 207 by means of the storage control section 238.

The AF sensor 211 is a phase difference sensor that sets a plurality of ranging points for the subject space, and detects an amount of defocus of the subject image at each ranging point. A series of image capturing sequences starts by the operating section 208 receiving an operation from a user, and outputting an operating signal to the control section 201. Various operations such as AF and AE related to the image capturing sequences are executed under control of the control section 201. For example, the control section 201 analyzes a detection signal of the AF sensor 211 and performs focus control for moving the focus lens making up a part of the image capturing lens 20.

Figure 2A:
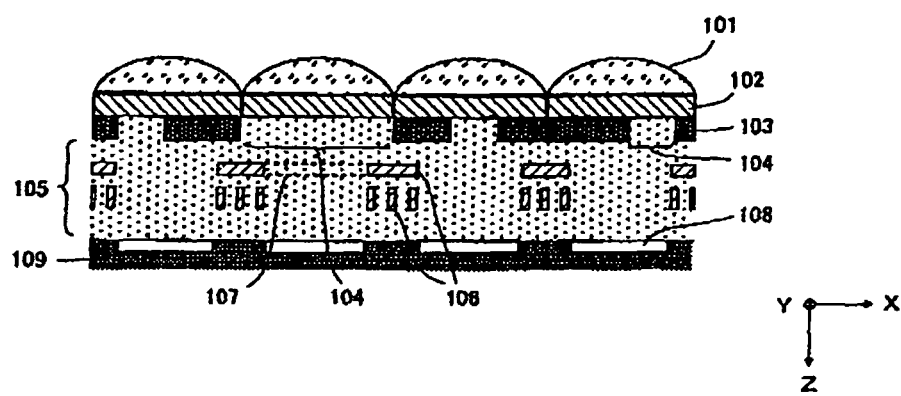
FIG. 2A is a schematic view of a cross section of an image capturing element according to an embodiment of the present invention.
Figure 2B:
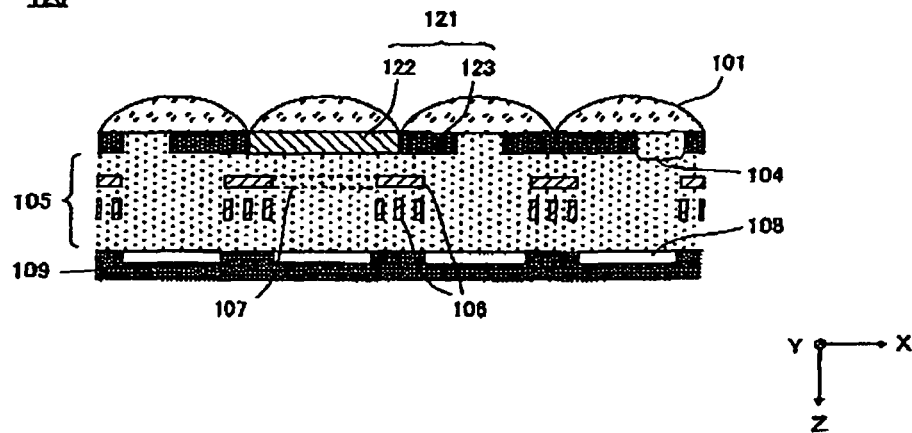
FIG. 2B is a schematic view of a cross section of an image capturing element according to an embodiment of the present invention.

Next, the configuration of the image capturing element 100 is detailed. FIG. 2A and FIG. 2B are a schematic view of a cross section of an image capturing element according to an embodiment of the present invention. FIG. 2A is a schematic view of a cross section of an image capturing element 100 in which the color filter 102 and the opening mask 103 are included as separate entities. On the other hand, FIG. 2B is a schematic view of a cross section of an image capturing element 120 having a screen filter 121 in which the color filter section 122 and the opening mask section 123 are integrally formed. The image capturing element 120 is a modification example of the image capturing element 100.

As shown in FIG. 2A, in the image capturing element 100, a micro lens 101, a color filter 102, an opening mask 103, a wiring layer 105, and a photoelectric conversion element 108 are arranged in this order from the side of the subject. The photoelectric conversion element 108 is made up of a photodiode that converts incident light into an electric signal. A plurality of photoelectric conversion elements 108 are arranged two dimensionally on the surface of the substrate 109.

The image signal resulting from conversion by the photoelectric conversion element 108, the control signal for controlling the photoelectric conversion element 108, or the like are transmitted and received via the wiring 106 provided for the wiring layer 105. In addition, the opening mask 103 having openings 104 provided in one-to-one relation to the photoelectric conversion elements 108 contact the wiring layer. As detailed later, the openings 104 are shifted for the corresponding photoelectric conversion elements 108, and their relative positions are strictly determined. The opening mask 103 including this opening 104 operates to generate the parallax to the subject light flux received by the photoelectric conversion element 108 as detailed later.

On the other hand, there is no opening mask 103 provided on the photoelectric conversion elements 108 not desired to generate any parallax. It can also be said that an opening mask 103 having an opening 104 which does not restrict incident subject light flux to the corresponding photoelectric conversion element 108, i.e., which transmits the entire effective light flux, is provided. Or, the wiring 106 can be interpreted as an opening mask that transmits the entire effective light flux that does not cause parallax, since it is practically the wiring 106 that defines the opening 107 through which the incident subject light flux is defined. The opening masks 103 may be arranged independently from each other to correspond to the respective photoelectric conversion elements 108, or alternatively may be formed collectively to the plurality of photoelectric conversion elements 108 just as done to produce the color filters 102.

The color filters 102 are provided on the opening masks 103. The color filters 102 are filters provided in one-to-one relation to the photoelectric conversion elements 108 and are each colored to transmit a specific wavelength region towards the corresponding photoelectric conversion element 108. For outputting a color image, it is preferable to arrange three or more types of color filters. These color filters can be interpreted as the primary color filters for generating a color image. An exemplary combination of the primary color filters may consist of a red filter transmitting a red wavelength region, a green filter transmitting a green wavelength region, and a blue filter transmitting a blue wavelength region. The color filters are arranged in a grid formation to correspond to the photoelectric conversion elements 108 as detailed later. The color filters may also be arranged in a combination of YeCyMg complementary color filters, and not limited to the combination of the primary colors RGB.

The micro lenses 101 are provided on the color filters 102. The micro lenses 101 are light-collecting lenses for guiding incident subject light flux as much as possible onto the photoelectric conversion elements 108. The micro lenses 101 are provided in one-to-one relation to the photoelectric conversion lenses 108. It is preferable that the optical axes of the micro lenses 101 are shifted so that as much subject light flux as possible can be guided to the photoelectric conversion elements 108, taking into consideration the relative positional relation between the center of the pupil of the image capturing lens 20 and the photoelectric conversion element 108. Moreover, the position of the micro lenses 101 may be adjusted together with the position of the openings 104 of the opening masks 103, so that the specific subject light flux explained later can be received as much as possible.

A unit made of a single opening mask 103, a single color filter 102, and a single micro lens 101 provided in one-to-one relation to a photoelectric conversion element 108 are referred to as "pixel." In particular, a pixel provided with an opening mask 103 causing parallax is referred to as "parallax pixel," and a pixel not provided with any opening mask 103 is referred to as "non-parallax pixel." For example, when an image capturing element 100 has an approximately 24 mm×16 mm effective pixel region, the number of pixels will be about 12 million.

Note that no micro lens 101 would be necessary for an image sensor having favorable light collecting efficiency and photoelectric conversion efficiency. The back side illumination image sensor is provided with the wiring layer 105 at the side opposite to the side at which the photoelectric conversion elements 108 are provided.

There may be various modification examples to the combination of the color filter 102 and the opening mask 103. For example, by adding a color component to the opening section 104 of the opening mask 103 in the example of FIG. 2A, the color filter 102 and the opening mask 103 can be integrally formed. In another example in which a specific pixel is used to obtain brightness information of a subject, the pixel needs not be provided with any color filter 102. Alternatively, it is also possible to provide an uncolored transparent filter so as to transmit almost all the wavelength regions of the visible light.

When the pixel used to obtain brightness information is made as a parallax pixel (i.e., when a parallax image is at least temporarily outputted as a monochroic image), the image capturing element 120 of the configuration shown as FIG. 2B can be adopted. To be more specific, the screen filter 121, in which the color filter section 122 functioning as a color filter and the opening mask section 123 including the opening section 104 are integrally formed, may be provided between the micro lens 101 and the wiring layer 105.

In the color filter section 122, the screen filter 121 is colored in blue, green, and red, and the masking portions in the opening mask section 123 excluding the opening section 104 are colored in block, for example. The image capturing element 120 that adopts the screen filter 121 has higher light collecting efficiency than the image capturing element 100 because of shorter distance from the micro lens 101 to the photoelectric conversion element 108.

Figure 3:
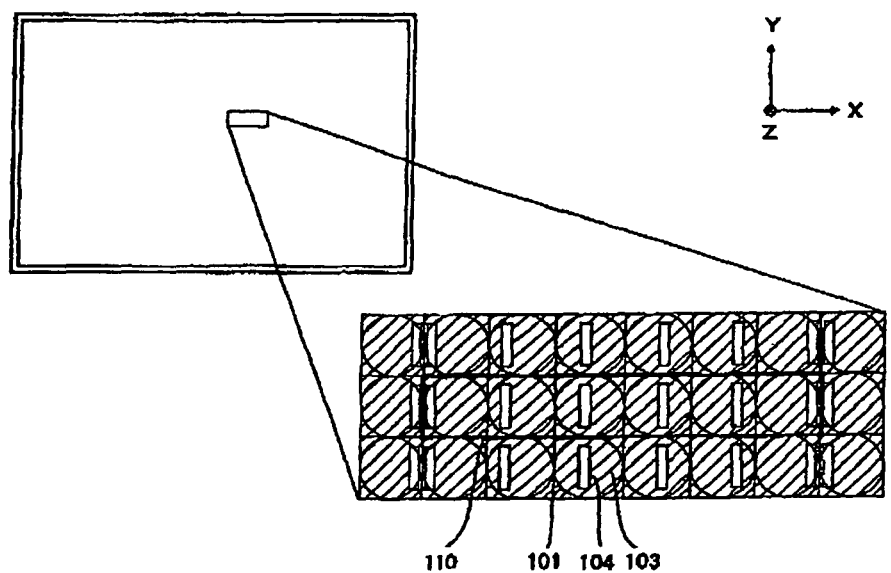
FIG. 3 is a schematic enlarged view of a part of an image capturing element.

The following explains the openings 104 of the opening mask 103 and their relation with the caused parallax. FIG. 3 is a schematic enlarged view of a part of an image capturing element 100. So as to simplify the explanation for the moment, the colors of the color filters 102 are not considered until later. In the following explanation before the colors of the color filters 102 are taken into consideration, the image sensor can be considered as a collection of parallax pixels all of which have a color filter 102 of the same color (including a transparent color filter). Therefore, the repetitive pattern explained below can be considered as pixels adjacent to each other in the color filter 102 of the same color.

As shown in FIG. 3, the openings 104 of the opening mask 103 are provided to be shifted relative to the corresponding pixels. Moreover, openings 104 respectively of adjacent pixels have been displaced to each other.

In the example shown in this drawing, there are six types of opening masks 103 provided whose openings 104 corresponding to the pixels are shifted from each other in X direction. From the perspective of the entire image capturing element 100, groups of photoelectric conversion elements are arranged two dimensionally as well as periodically, each group of photoelectric conversion element being made up of a set of six parallax pixels within which the opening masks 103 gradually shift from −X to +X. The image capturing element 100 can also be expressed such that the repetitive patterns 110 each including a set of photoelectric conversion elements are periodically arranged.

Figure 4:
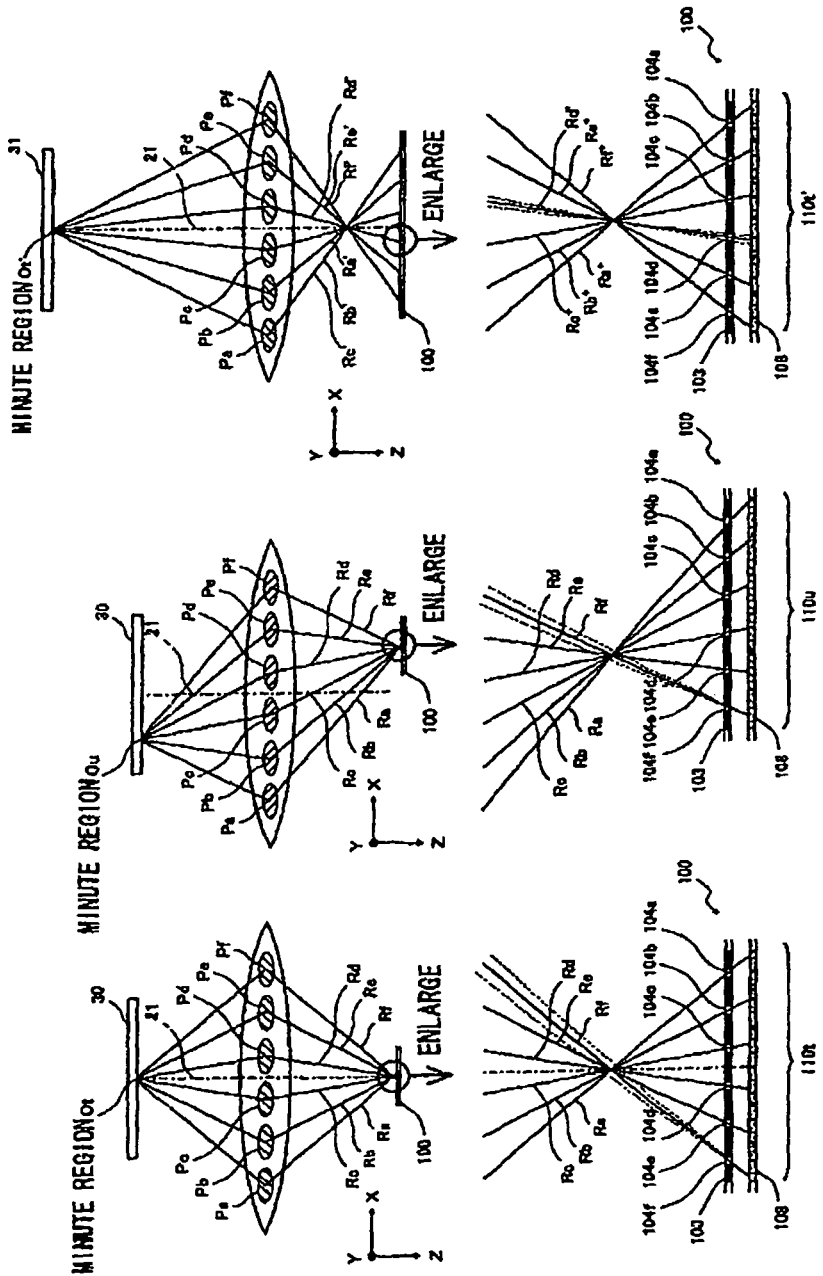
FIG. 4A is a conceptual diagram for explaining the relation between a parallax pixel and a subject.
FIG. 4B is a conceptual diagram for explaining the relation between a parallax pixel and a subject.
FIG. 4C is a conceptual diagram for explaining the relation between a parallax pixel and a subject.

FIG. 4A, FIG. 4B, and FIG. 4C are a conceptual diagram for explaining the relation between a parallax pixel and a subject. FIG. 4A especially represents a group of photoelectric conversion elements of the repetitive pattern 110$t$ arranged at the center orthogonal to the image capturing optical axis 21, in the image capturing element 100, and FIG. 4B schematically shows a group of photoelectric conversion elements of a repetitive pattern 110$u$ arranged at the peripherals. The subject 30 in FIG. 4A and FIG. 4B exists at the focus position of the image capturing lens 20. FIG. 4C schematically shows the relation in a case in which the subject 31 existing on the non-focus position for the image capturing lens 20 is captured, in contrast to FIG. 4A.

First, the relation between a parallax pixel and a subject when the image capturing lens 20 has captured the subject 30 at the focus state is explained. The subject light flux passes through the pupil of the image capturing lens 20 to be guided towards the image capturing element 100. There are six partial regions Pa-Pf defined for the entire cross section through which the subject light flux passes. As is clear from the enlarged view, the pixels of the group of photoelectric conversion elements constituting the repetitive patterns 110$t$ and 110$u$ at −X side are arranged to define the position of the opening 104$f$ of the opening mask 103 so that only the subject light flux emitted from the partial region Pf can reach the photoelectric conversion element 108. Likewise, with respect to the rightmost pixels, the position of the opening 104$e$ is defined to correspond to the partial region Pe, the position of the opening 104$d$ is defined to correspond to the partial region Pd, the position of the opening 104c is defined to correspond to the partial region Pc, the position of the opening 104b is defined to correspond to the partial region Pb, and the position of the opening 104a is defined to correspond to the partial region Pa.

It can also be said that the position of the opening 104f is defined by the gradient of the principle light ray Rf emitted from the partial region Pf that is defined by the relative positional relation between the partial region Pf and the pixel at the endmost pixel at −X side. When the photoelectric conversion element 108 receives the subject light flux from the subject 30 existing on the focused position via the opening 104f, the subject light flux forms an image on the photoelectric conversion element 108 as shown by the dotted lines. Likewise, it can be expressed such that with respect to the endmost pixel at +X side, the position of the opening 104e is determined by the gradient of the principle light ray Re, the position of the opening 104d is determined by the gradient of the principle light ray Rd, the position of the opening 104c is determined by the gradient of the principle light ray Rc, the position of the opening 104b is determined by the gradient of the principle light ray Rb, and the position of the opening 104a is determined by the gradient of the principle light ray Ra.

As shown in FIG. 4A, the light flux of the subject 30 existing on Me focused position emitted from the minute region Ot on the subject 30 crossing the optical axis 21 passes the pupil of the image capturing lens 20 to reach each pixel of the group of photoelectric conversion elements constituting the repetitive pattern 110t. In other words, each pixel in the group of photoelectric conversion elements constituting the repetitive pattern 110t receive the light flux emitted from a single minute region Ot via six partial regions Pa-Pf respectively. The minute region Ot has a spread that can accommodate the positional displacement of each pixel of the group of photoelectric conversion elements constituting the repetitive pattern 110t, however can be approximated to substantially one object point. Likewise as shown in FIG. 4B, the light flux of the subject 30 existing on the focused position emitted from the minute region Ou on the subject 30 distanced from the optical axis 21 passes the pupil of the image capturing lens 20 to reach each pixel of the group of photoelectric conversion elements constituting the repetitive pattern 110u. In other words, each pixel in the group of photoelectric conversion elements constituting the repetitive pattern 110u receives the light flux emitted from a single minute region Ou via six partial regions Pa-Pf respectively. Just as the minute pattern Ot, the minute region Ou has a spread that can accommodate the positional displacement of each pixel of the group of photoelectric conversion elements constituting the repetitive pattern 110u, however can be approximated to substantially one object point.

Therefore, as long as the subject 30 exists on the focused position, there are different minute regions caught by the group of photoelectric conversion elements depending on the position of the repetitive pattern 110 on the image capturing element 100, and that each pixel constituting the group of photoelectric conversion elements catches the same minute region via partial regions different from one another. Across the repetitive patterns 110, the pixels corresponding to each other receive the subject light flux from the same partial region. In the example of the drawings, the endmost pixels at −X side of the repetitive pattern 110t and 110u receive the subject light flux from the same partial region Pf.

Note that the position of the opening 104f through which the endmost pixel at −X side receives the subject light flux from the partial region Pf in the repetitive pattern 110t arranged at the center orthogonal to the image capturing optical axis 21 is different, in a strict sense, from the position of the opening 104f through which the endmost pixel at −X side receives the subject light flux from the partial region Pf in the repetitive pattern 110u arranged at the peripherals. However, from the functional point of view, they can be treated as the same type of opening mask in the sense that they both are an opening mask for receiving the subject light flux from the partial region Pf. Therefore, each of the parallax pixels arranged on the image capturing element 100 in the example of FIG. 4A, FIG. 4B, and FIG. 4C can be said to include one of the six types of opening masks.

Next, the relation between the parallax pixel and a subject when the image capturing lens 20 has captured the subject 30 at a non-focus state is explained. In this case too, the subject light flux from the subject 31 existing on the non-focus position pass the six partial regions Pa-Pf of the pupil of the image capturing lens 20, to reach the image capturing element 100. Note that the subject light flux from the subject 31 existing on the non-focused position forms an image at a position different than on the photoelectric conversion element 108. For example as shown in FIG. 4C, when the subject 31 exists farther from the image capturing element 100 than the subject 30, the subject light flux forms an image nearer the subject 31 than the photoelectric conversion element 108, as shown in the enlarged view of FIG. 4C. Conversely, when the subject 31 is closer to the image capturing element 100 than the subject 30, the subject light flux forms an image at an opposite side of the photoelectric conversion element 108 with respect to the subject 31.

Therefore, the subject light flux of the subject 31 existing on the non-focus position emitted from the minute region Ot' reaches the corresponding pixel in different sets of repetitive patterns 110 depending on which of the six partial regions Pa-Pf the subject light flux passes. For example, the subject light flux passed through the partial region Pd is incident to the photoelectric conversion element 108 having the opening 104d included in the repetitive pattern 110t' as the principle light ray Rd' as shown in the enlarged view of FIG. 4C. Even among the subject light flux emitted from the minute region Ot', the subject light flux passed the other partial region will not incident on the photoelectric conversion element 108 included in the repetitive pattern 110t', but will be incident to the photoelectric conversion element 108 including the corresponding opening in the other repetitive pattern. In other words, the subject light fluxes reaching respective photoelectric conversion elements 108 constituting the repetitive pattern 110t' are subject light fluxes emitted from different minute regions from each other of the subject 31. In other words, the subject light flux having Rd' as the principle light ray is incident on the 108 corresponding to the opening 104d, whereas to the photoelectric conversion elements 108 corresponding to the other openings, the subject light fluxes having Ra+, Rb+, Rc+, Re+, and Rf+ as the principle light ray are incident. These subject light fluxes are respectively emitted from different minute regions of the subject 31. This relation holds true for the repetitive pattern 110u arranged in the peripheral portion in FIG. 4B.

From the point of view of the entire image capturing element 100, the subject image A caught by the photoelectric conversion element 108 corresponding to the opening 104a does not displace from the subject image D caught by the photoelectric conversion element 108 corresponding to the opening 104d when these subject images correspond to the subjects existing on the focused position, and if the subject images correspond to the subjects existing on the non-focused position, the subject images are displaced with each other. The direction and the amount of the displacement are determined by such factors as how much the subject existing on the non-focused position is displaced in which direction and in what amount from the focused position, and the distance between the partial region Pa and the partial region Pd. In other words, the subject image A and the subject image D are parallax Images with respect to each other. This relation holds true for the other openings, and so six parallax images corresponding to the openings 104a-104f are generated. The direction in which the partial regions Pa through Pf are arranged is referred to "parallax direction". In this case, the parallax direction is the X axis direction.

Therefore, a parallax image is obtained by collecting the output of the pixels corresponding to each other from each repetitive pattern 110 configured in this way. That is, the output of the pixels received the subject light fluxes emitted from each specific partial region from the six partial regions Pa-Pf forms a parallax image. This configuration enables to capture a parallax image by a single image capturing lens 20 without needing any complex optical system.

Figure 5:
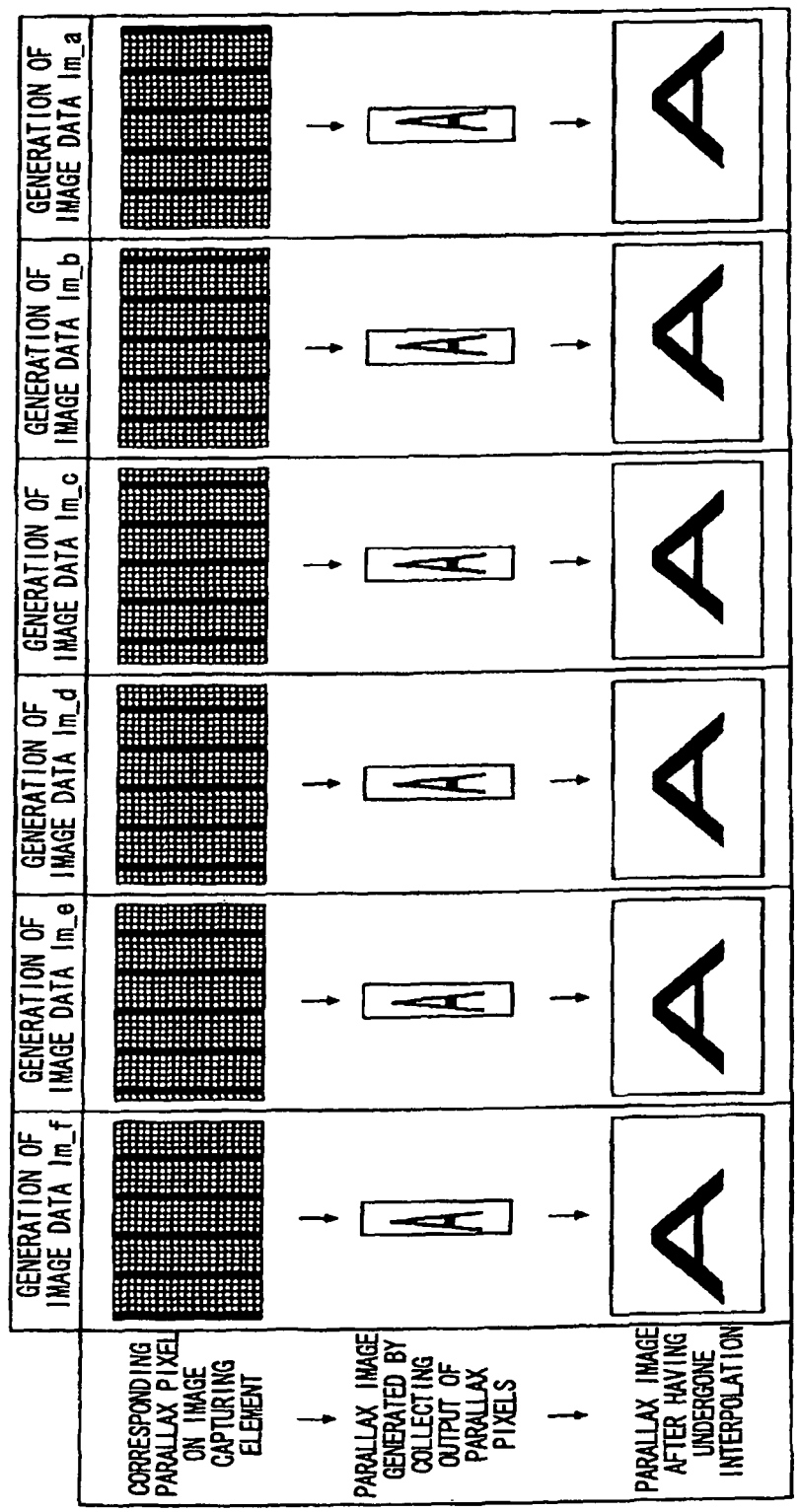
FIG. 5 is a conceptual diagram for explaining a process to generate a parallax image.

FIG. 5 is a conceptual diagram for explaining a process to generate a parallax image. The drawing shows, from the left of the drawing, generation of the parallax image data Im_f generated by collecting the output of the parallax pixels corresponding to the opening 104f, generation of the parallax image data Im_e generated by collecting the output of the parallax pixels corresponding to the opening 104e, generation of the parallax image data Im_d generated by collecting the output of the parallax pixels corresponding to the opening 104d, generation of the parallax image data Im_c generated by collecting the output of the parallax pixels corresponding to the opening 104c, generation of the parallax image data Im_b generated by collecting the output of the parallax pixels corresponding to the opening 104b, and generation of the parallax image data Im_a generated by collecting the output of the parallax pixels corresponding to the opening 104a. First, the generation of the parallax image data Im_f generated by the output from the opening 104f is explained.

The repetitive patterns 110 each made up of a photoelectric conversion element group made of a set of six parallax pixels are arranged as an array in X direction. The parallax pixels having the opening 104f are positioned on the image capturing element 100 in every six pixels in the X axis direction and to be consecutive in the Y axis direction. These pixels receive the subject light flux from minute regions different from each other as stated above. Therefore, by arranging the collection of the output of these parallax pixels, a horizontal parallax image in the X axis direction is obtained.

However, each pixel of the image capturing element 100 according to the present embodiment is a square pixel. Therefore, by simply collecting them, the number of pixels in the X axis direction will be thinned out to ⅙, resulting in image data that is long in the Y axis direction. By applying interpolation processing to generate six times the number of pixels in the X axis direction, the parallax image data Im_f is generated as an image having the original aspect ratio. However, since the parallax image data before subjected to interpolation is the image thinned out to ⅙ in the X axis direction, the resolution of the resulting image in the X axis direction is lower than the resolution in the Y axis direction. This suggests the incompatibility between the number of parallax Image data generated and the improvement of resolution.

As a result of similar processing, the parallax image data Im_e—the parallax image data Im_a are obtained. That is, the digital camera 10 can generate six parallax images from six different view points having parallaxes in the X axis direction.

Figure 6A:
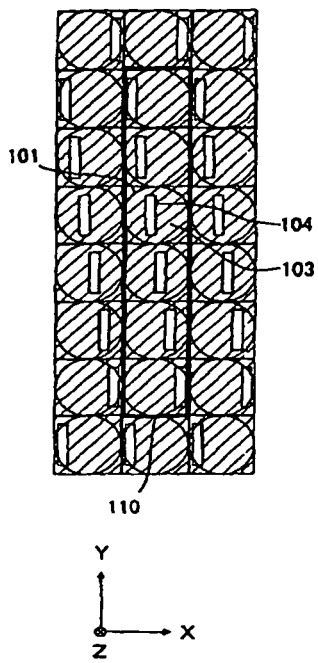
FIG. 6A shows another example of a repetitive pattern.
Figure 6B:
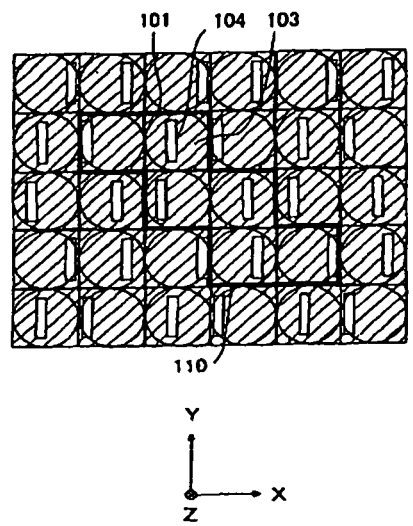
FIG. 6B shows another example of a repetitive pattern.

In the above example, the repetitive pattern 110 was explained as an array in the X axis direction. However, the repetitive pattern 110 is not limited to this example. FIGS. 6A and 6B show different examples of the repetitive pattern 110.

FIG. 6A is an example in which six pixels arranged in the Y axis direction are selected as a repetitive pattern 110. It may be noticed that the openings 104 of the parallax pixels gradually shift from the −X side to the +X side starting from the endmost parallax pixel on +Y side down to the −Y side. The repetitive pattern 110 in such an arrangement can also be used to generate parallax images having six view points giving parallax in the X axis direction. Compared to the repetitive pattern 110 of FIG. 3, this repetitive pattern can be said as a repetitive pattern that can maintain the resolution in the X side direction at the cost of resolution in the Y axis direction.

FIG. 6B is an example in which six pixels adjacent in an oblique direction with respect to the X axis on the XY plane are used as a repetitive pattern 110. It may be noticed that the openings 104 of the parallax pixels gradually shift from the −X side to the +X side starting from the endmost parallax pixel at −X and +Y towards the +X and −Y direction. The repetitive pattern 110 in such an arrangement can also be used to generate parallax images having six view points giving parallax in the X axis direction. Comparing with the repetitive pattern 110 of FIG. 3, this repetitive pattern can be said as a repetitive pattern that can maintain the resolutions in both the Y axis and X axis directions to some extent while increasing the number of parallax images.

Comparing the repetitive pattern 110 of FIG. 3 with the repetitive patterns 110 respectively of FIG. 6A and FIG. 6B, their difference boils down to whether they sacrifice the resolution in the Y axis direction or the X axis direction compared to the resolution of a single image made from the entire image when attempting to generate parallax images from six view points. The repetitive pattern 110 of FIG. 3 makes the resolution in the X axis direction to ⅙. The repetitive pattern 110 of FIG. 6A makes the resolution in the Y axis direction to ⅙. The repetitive pattern 110 of FIG. 6B cuts the resolution to ⅓ in the Y axis direction and to ½ in the X axis direction. In either case, one pattern includes openings 104a-104f that each are corresponded with a pixel. Each of the openings 104a-104f is to receive the subject light flux from the corresponding one of the partial regions Pa-Pf. Therefore, each repetitive pattern 110 has the same amount of disparity.

Figure 7:
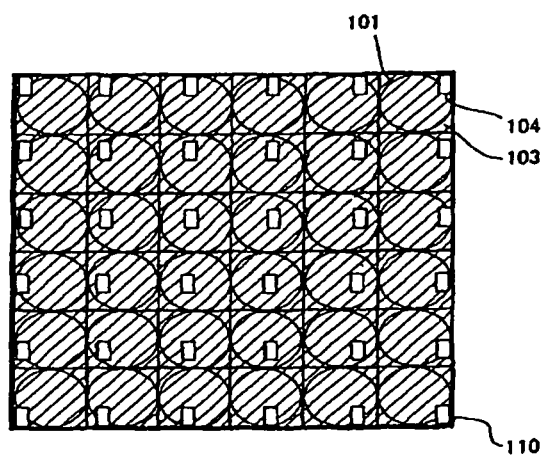
FIG. 7 shows an example of a two-dimensional repetitive pattern.

The above examples are directed to generation of a parallax image for giving parallax in the lateral direction. However, it is possible to generate a parallax image for giving parallax in the longitudinal direction and two dimensionally in both of the longitudinal and lateral directions. FIG. 7 shows an example of a two-dimensional repetitive pattern 110.

The example of FIG. 7 shows a repetitive pattern 110 that has 36 pixels (six pixels in the X axis direction and six pixels in the Y axis direction) as a set of photoelectric conversion elements. In addition, 36 types of opening masks 103 are prepared to shift the openings 104 for the pixels in the Y axis and X axis directions. Specifically, the openings 104 are arranged so that they gradually shift from +Y to −Y direction from the endmost pixel at +Y to the endmost pixel at −Y of the repetitive pattern 110, as well as gradually shifting from the −X to the +X from the endmost pixel at −X to the endmost pixel at +X.

The image capturing element 100 having this repetitive pattern 110 can output parallax images of 36 view points that can give parallax in both of the longitudinal direction and the lateral direction. It is needless to say that the repetitive pattern 110 is not limited to the example shown in FIG. 7, and can be determined arbitrarily so as to output parallax images of a different number of view points.

The example stated above adopts rectangular openings 104. In the arrangement that gives parallax in the lateral direction in particular, the amount of light can be secured for the photoelectric conversion element 108 by making the width in the Y direction not shifted to be wider than the width in the X direction to be shifted. However, the shape of the openings 104 is not limited to rectangular.

Figure 8:
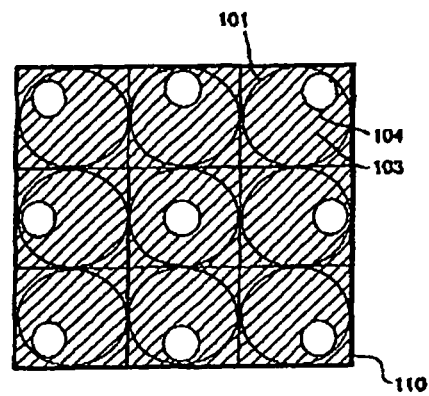
FIG. 8 explains another shape of an opening.

FIG. 8 explains another shape of an opening 104. In this drawing, the shape of the opening 104 is defined as round. A round opening 104 can prevent unintended subject light flux from being incident on the photoelectric conversion element 108 as stray light, thanks to the similarity to the hemispherical shape of the micro lens 101.

Figure 9:
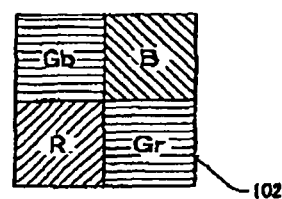
FIG. 9 explains a Bayer array.

The following is an explanation on the color filter 102 and the parallax image. FIG. 9 explains a Bayer array. As shown in this drawing, in the Bayer array, the endmost pixel both in −X and +Y and the endmost pixel both in −X and −Y are green filters, the endmost pixel in −X and −Y is a red filter, and the endmost pixel in +X and +Y is a blue filter. In this specification, the endmost pixel in −X and +Y assigned a green filter is referred to as a Gb filter, and the endmost pixel in +X and −Y assigned another green filter is referred to as a Gr pixel. In addition, the pixel assigned a red filter is referred to as a R pixel, and the pixel assigned a blue filter is referred to as a B pixel. The X axis direction along which the Gb pixel and the B pixel are aligned is referred to as a Gb row, and the X axis direction along which the R pixel and the Gr pixel are aligned is referred to as a Gr row. The Y axis direction along which the Gb pixel and the R pixel are aligned is referred to as a Gb column, and the Y axis direction along with the B pixel and the Gr pixel are aligned is referred to as a Gr column.

An enormous number of repetitive patterns 110 can be configured for a particular array of color filters 102 by determining which parallax pixel and non-parallax pixel are to be assigned and in which periodicity and for which colored pixel. By collecting the output of the non-parallax pixels, the captured image data can be without parallax just as a normal captured image. By increasing the ratio of the non-parallax images, a 2D image having a high resolution can be outputted. However, this repetitive pattern may not be suited for a 3D image composed of a plurality of parallax images because it is expected that the image quality will degrade because of a relatively small ratio of parallax pixels. Conversely, by increasing the ratio of parallax pixels, a 3D image will have increased image quality, while in the case of a 2D image, the resolution thereof will be low.

In the trade-off relation stated above, various repetitive patterns 110 having various features can be set by determining the positioning of the parallax pixels and the non-parallax pixels. FIG. 10 explains various examples in which parallax pixels are allocated to a Bayer array when there are two kinds of parallax pixels. The examples assume the parallax Lt pixel whose opening 104 is decentered towards −X side from the center, and the parallax Rt pixel whose opening 104 is decentered towards +X side from the center.

That is, the two view point parallax images outputted from the parallax images realize a so-called stereoscopic vision.

Please refer to the drawing for the explanation of the features of the repetitive patterns. For example, if many non-parallax pixels are assigned, it will make 2D image data of a high resolution. If non-parallax pixels are assigned uniformly across the RGB pixels, it will make 2D image data having a high image quality without less color shift.

On the other hand, when many parallax pixels are assigned, it will make 3D image data of a high resolution. If parallax pixels are assigned uniformly across the RGB pixels, the 3D image will have favorable color reproduction and high quality for a 3D image.

Figure 11:
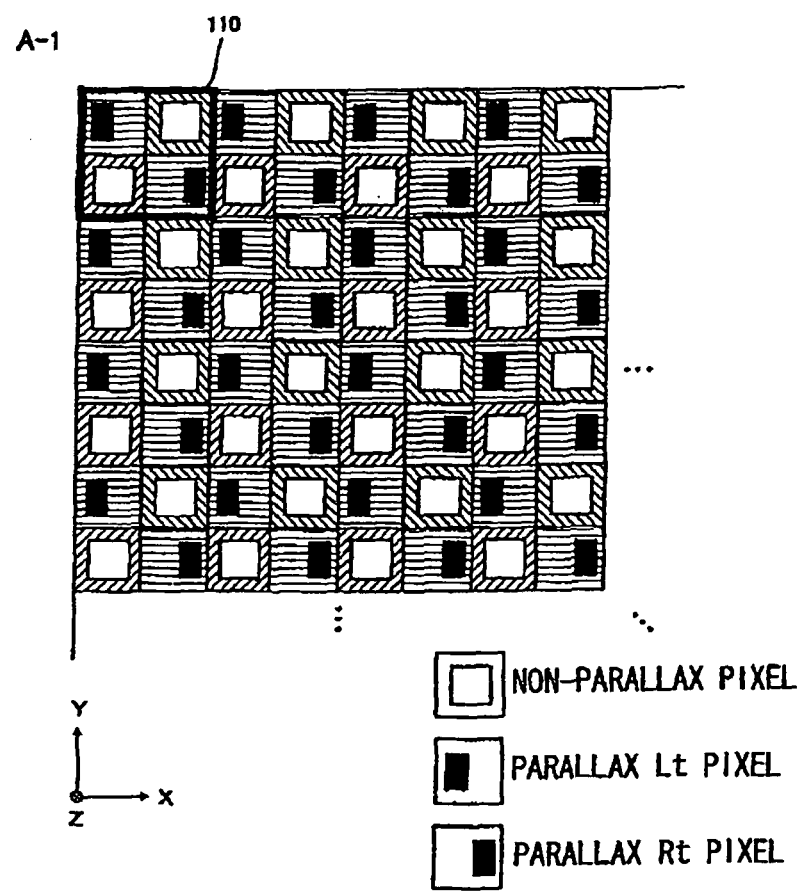
FIG. 11 shows an example of a different variation.

The following explains some variations. FIG. 11 shows an example of a different variation. The variation shown in FIG. 11 corresponds the classification A-t of the repetitive patterns of FIG. 10.

In the example of the drawing, the same four pixels used in the Bayer array are used as the repetitive pattern 110. The R pixel and the B pixel are non-parallax pixels, and the Gb pixel is assigned to the parallax Lt pixel and the Gr pixel to the parallax Rt pixel. In this case, the openings 104 are determined so that the parallax Lt pixel and the parallax Rt pixel contained in the same repetitive pattern 110 can receive the subject light flux emitted from the same minute region, when the subject exists on the focused position.

In the example of the drawing, the Gb pixel and the Gr pixel are both green pixels having high luminosity, and so a parallax image having high contrast is expected to be obtained. In addition, both of the Gb pixel and the Gr pixel used are green pixels, and so the two outputs can be easily converted to an output without parallax. Therefore, 2D image data having high image quality can be generated together with the output of the R pixel and the B pixel that are non-parallax pixels.

Figure 12:
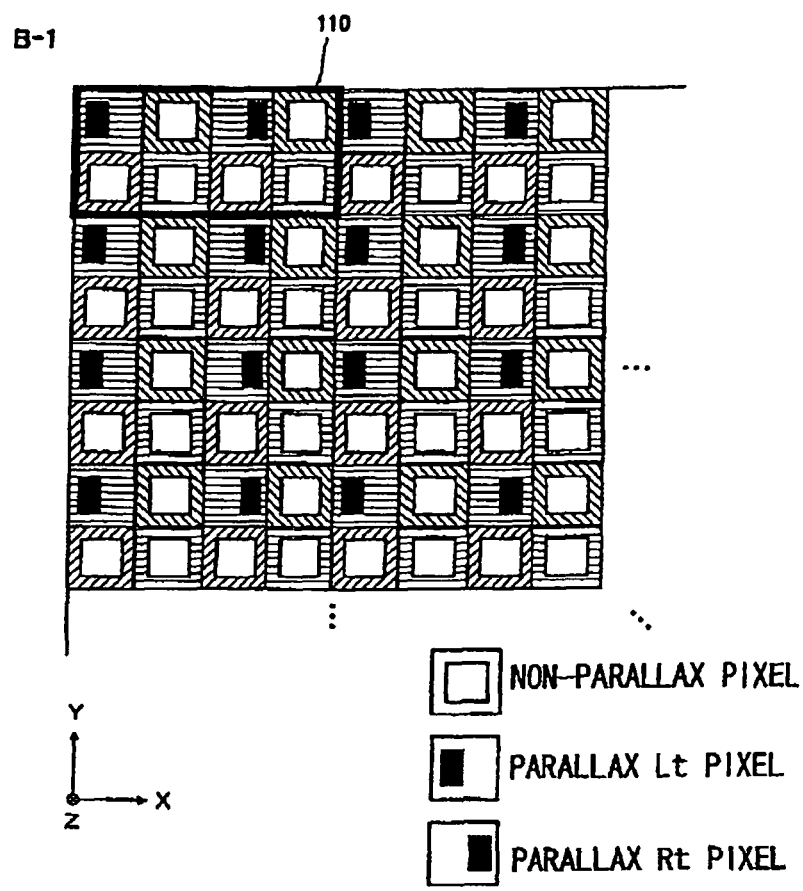
FIG. 12 shows an example of a different variation.

FIG. 12 shows an example of a different variation. The variation shown in FIG. 12 corresponds the classification B-1 of the repetitive patterns of FIG. 10.

In the example of the drawing, eight pixels having two sets of four pixels of the Bayer array arranged in the X axis direction are used as the repetitive pattern 110. Out of these eight pixels, the −X side Gb pixel is assigned the parallax Lt pixel, and the +X side Gb pixel is assigned the parallax Rt pixel. In this arrangement, the Gr pixel is set to be the non-parallax pixel, and so further enhanced image quality can be expected from the 2D image compared to the example of FIG. 10.

Figure 13:
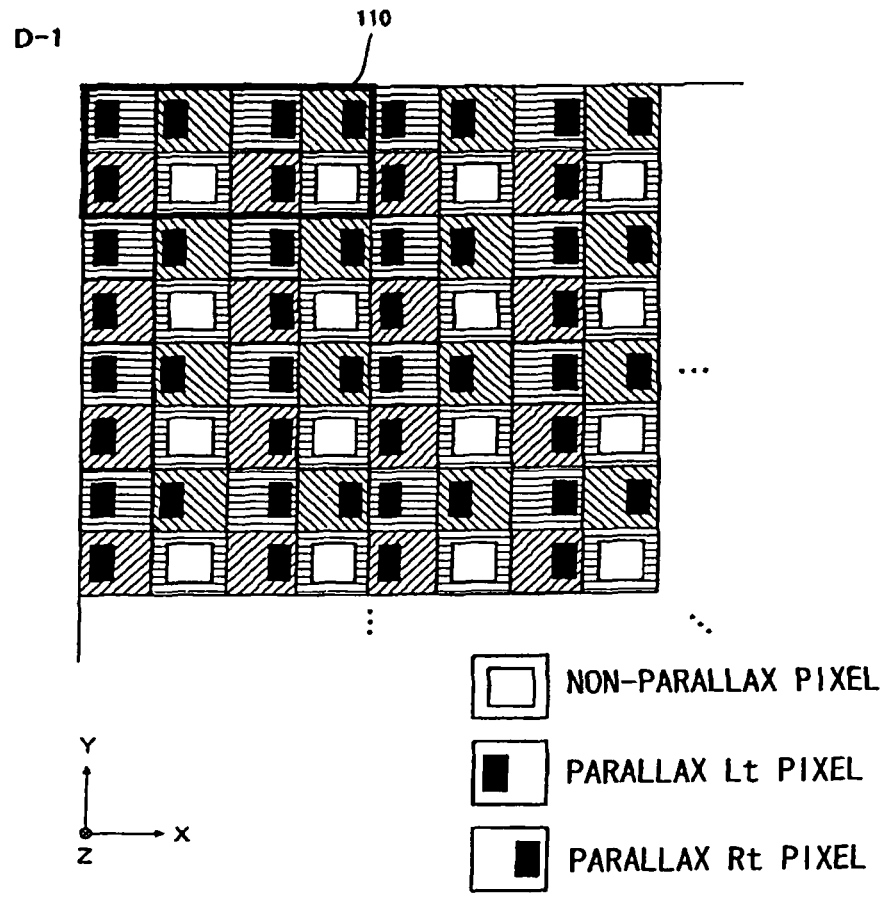
FIG. 13 shows an example of a different variation.

FIG. 13 shows an example of a different variation. The variation shown in FIG. 13 corresponds to the classification D-1 of the repetitive patterns of FIG. 10.

In the example of the drawing, eight pixels having two sets of four pixels of the Bayer array arranged in the X axis direction are used as the repetitive pattern 110. Out of these eight pixels, the −X side Gb pixel Is assigned the parallax Lt pixel, and the +X side Gb pixel is assigned the parallax Rt pixel. Further, the left R pixel is assigned the parallax L pixel, and the right R pixel is assigned the parallax R pixel. Further, the −X side B pixel is assigned the parallax Lt pixel, and the +X side B pixel is assigned the parallax Rt pixel. The two Gr pixels are assigned non-parallax pixels.

The parallax Lt pixel and the parallax Rt pixel assigned to the two Gb pixels receive the light flux emitted from a single minute region, when capturing a subject existing on the focused position. Both of the parallax L pixel and the parallax R pixel assigned to the two R pixels receive the light flux emitted from a single minute region different from that of the Gb pixel, and both of the parallax Lt pixel and the parallax Rt pixel assigned to the two B pixels receive the light flux emitted from a single minute region different from those of the Gb pixel and the R pixel. This helps increase the resolution of a 3D image three hold in the V axis direction compared to FIG. 12. Besides, three color output corresponding to RGB can be obtained, which realizes high quality 3D color image.

Note that when two kinds of parallax pixels are provided as explained above, it will produce parallax images of two view points. However, various numbers of types of parallax pixels can be adopted as explained with reference to FIG. 3, FIG. 7, and FIG. 8, or the like, according to the number of parallax images desired to be outputted. Various repetitive patterns 110 can be formed even when the number of view points is increased. Thus, the repetitive pattern 110 that suites to the particular specification, purpose, or the like can be selected.

The above-stated example adopts the Bayer array as a color filter array. However, other color filter arrangement can also be adopted. If such a color filter arrangement is adopted, each of the parallax pixels constituting a set of photoelectric conversion elements may preferably include an opening mask 103 having openings 104 facing different partial regions from each other.

Therefore, the image capturing element 100 may include photoelectric conversion elements 108 arranged two dimensionally and photoelectric converting incident light into an electric signal, opening masks 103 provided in a one-to-one relation with at least a part of the photoelectric conversion elements 108, and color filters 102 provided in a one-to-one relation with at least a part of the photoelectric conversion elements 108, where the openings 104 of the opening masks 103 provided to correspond to at least two (may be three or more) out of the n photoelectric conversion elements 108 adjacent to each other (n being an integer equal to or larger than 3) are included in a single pattern of the color filter patterns made of at least three types of color filters 102 transmitting respectively different wavelength regions, and transmit the light flux from partial regions different from each other in the sectional region of the incident light and groups of photoelectric conversion elements each made of a set of n photoelectric conversion elements 108 may be periodically arranged.

Figure 14:
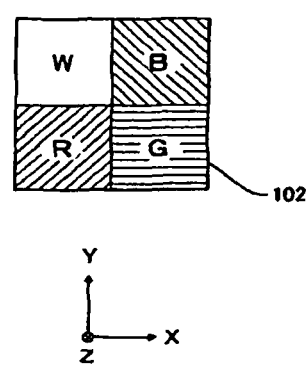
FIG. 14 shows another color filter array.

FIG. 14 explains another color filter array. As shown in the drawing, this color filter array is different from the Bayer array of FIG. 9 in that it has a W pixel to which no color filter is assigned instead of a Gb pixel, while keeping the Gr pixel of the Bayer array shown in FIG. 9 as a G pixel to which a color filter is assigned. Note that the W pixel may be assigned an uncolored transparent filter so as to transmit substantially all the wavelength region of the visible light as stated above.

The color filter array including the stated W pixel can obtain highly accurate brightness information because the amount of light received by the W pixel improves compared to a case in which the color filter is provided instead, although the color information outputted by the image capturing element is slightly degraded. It is even possible to form a monochroic image by collecting the output of W pixels.

In the color filter arrangement including a W pixel, there are various modification examples of the repetitive pattern 110 of parallax pixels and non-parallax pixels. For example, the contrast of a subject image is higher in the image outputted through the W pixel than the image outputted through the colored pixel, even though the images have both been captured under a relatively dark environment. Therefore, by assigning a parallax pixel to the W pixel, the operational result is expected to have high accuracy in the matching processing performed among a plurality of parallax images. As explained later, the matching processing is performed as a part of the processing to obtain the amount of disparity pixels. The repetitive pattern 110 of parallax pixels and non-parallax pixels is set taking into consideration not only the effect to the resolution of 2D images and the effect to the image quality of parallax images but also the tradeoff between merits and demerits to the other information to be extracted.

Figure 15:
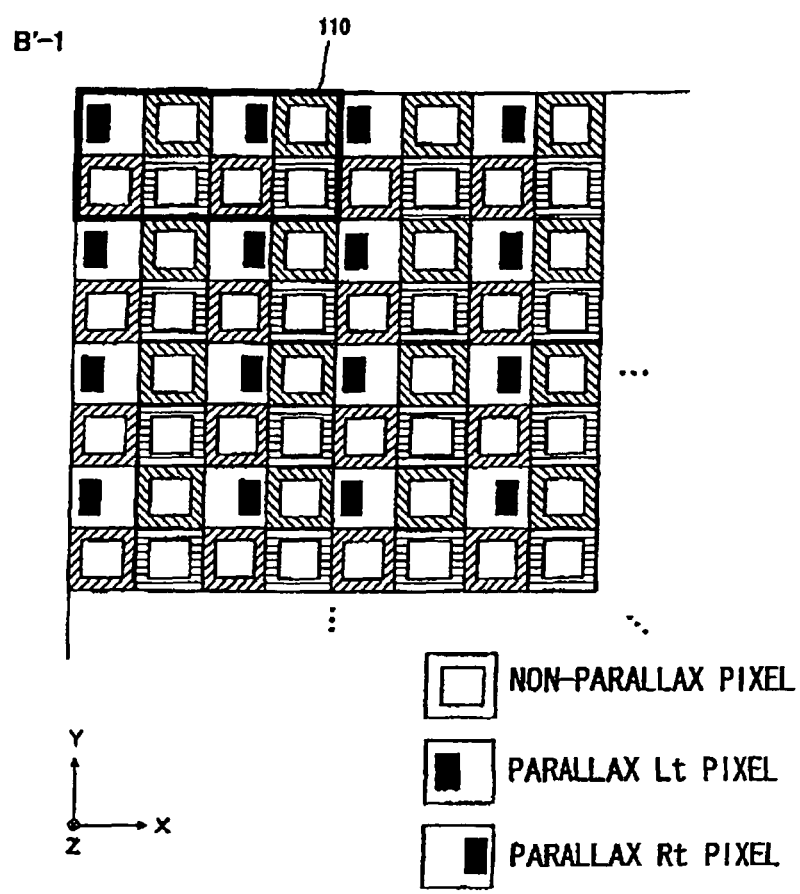
FIG. 15 shows an example of an array of W pixels and parallax pixels.

FIG. 15 shows an example of an array of W pixels and parallax pixels when another color filter array different from FIG. 14 is adopted. The variation shown in FIG. 15 is denoted as B'-1 because it is similar to the repetitive pattern classification B-1 of FIG. 12 which is one of the Bayer array. In the explanation of this drawing, the repetitive pattern 110 includes 8 pixels made of two sets of four pixels in another color filter arrangement oriented in the X axis. Among the eight pixels, the −X side W pixel is assigned a parallax Lt pixel, and the +X side W pixel is assigned a parallax Rt pixel. The image capturing element 100 having such an arrangement outputs a parallax image as a monochroic image and a 2D image as a colored image.

In this example, the image capturing element 100 includes photoelectric conversion elements 108 provided two dimensionally and photoelectric-converting incident light to an electric signal, opening masks 103 provided in a one-to-one relation to at least a part of the photoelectric conversion elements 108, and color filters 102 provided in a one-to-one relation to at least a part of the photoelectric conversion elements 108. Openings 104 of opening masks 103 provided to correspond to at least two of n (n being an integer equal to or greater than 4) photoelectric conversion elements 108 adjacent to each other may not be included in one of the color filter patterns constituted by at least three types of color filters 102 transmitting respectively different wavelength regions, and may be positioned to respectively transmit light fluxes from partial regions mutually different within the sectional region of the incident light, and that the groups of photoelectric conversion elements, each made up of a set of n photoelectric conversion elements 108, may be periodically arranged.

Figure 16:
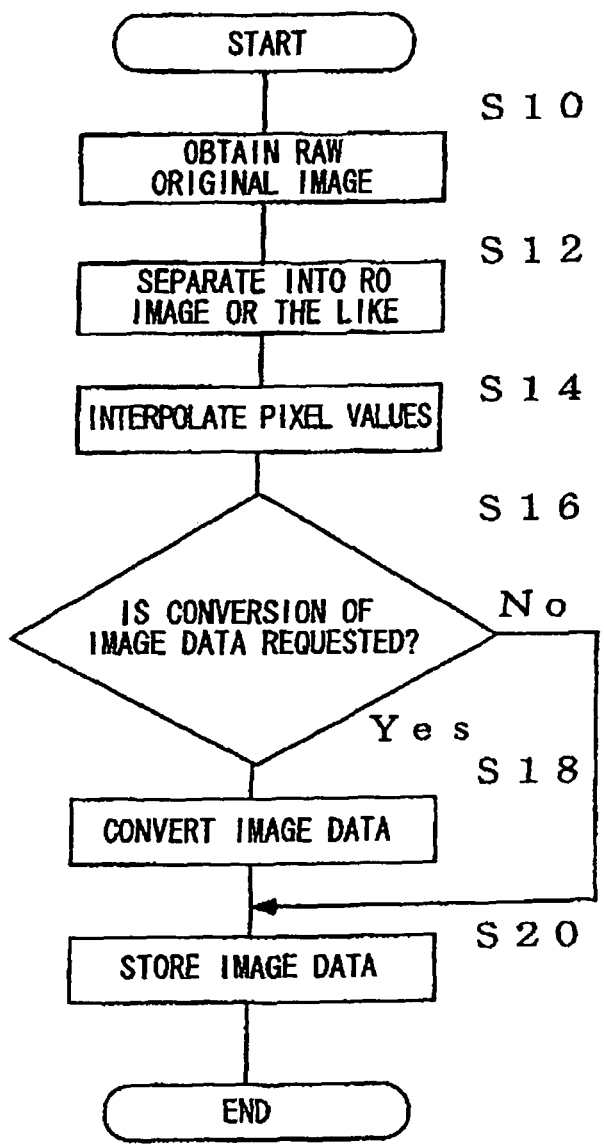
FIG. 16 is a flow chart showing an exemplary operation of a digital camera 10.

FIG. 16 is a flow chart showing an exemplary operation of a digital camera 10. The flow chart of FIG. 16 is started when a captured image is obtained from the image capturing element 100.

The image obtaining section 231 obtains RAW original image data resulting from conversion of a signal of the image capturing element 100 in the A/D converter 202 (S10). Here, an example of the RAW original image data is data resulting after A/D conversion of a signal from the image capturing element 100 and before providing demosaicing to the empty grid pixels. Not limited to this, the RAW original image data may also be image data after some correction or invertible image processing such as invertible compression given to the signal after it was A/D converted.

Figure 17:
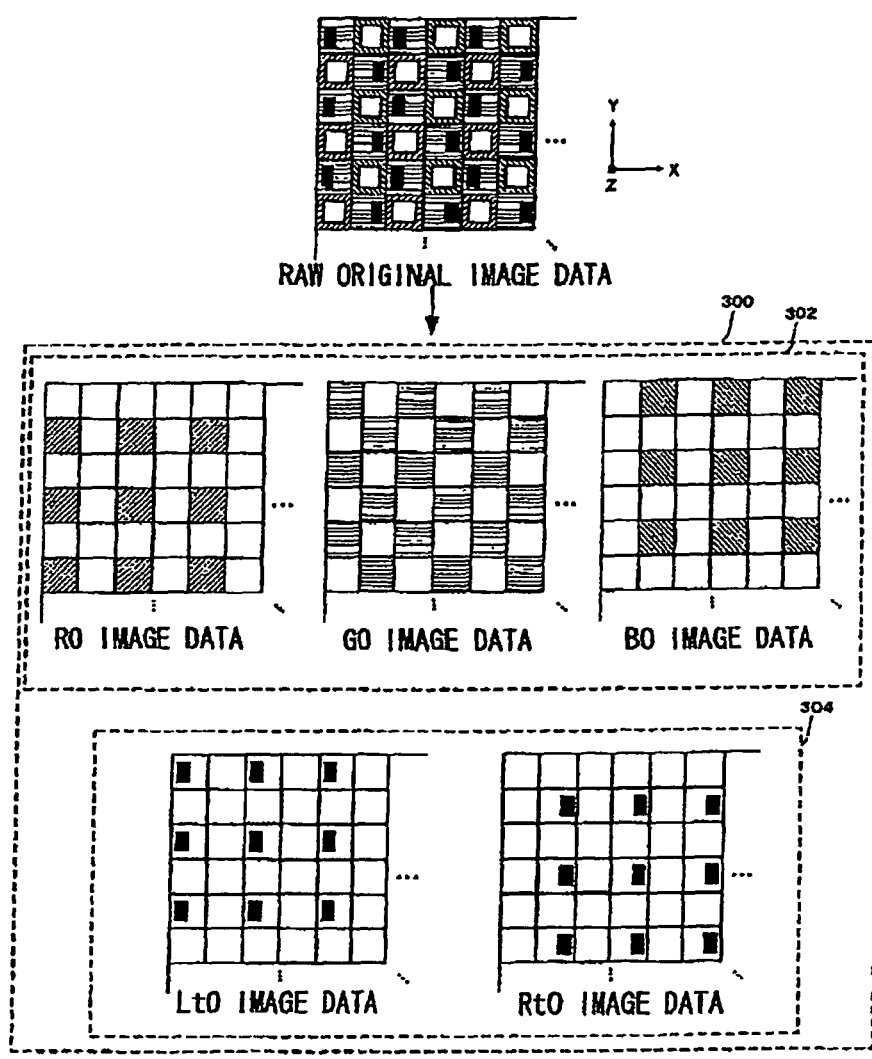
FIG. 17 shows an example of image data dealt with by the digital camera 10.

FIG. 17 shows an example of image data dealt with by the digital camera 10. The upper raw of FIG. 17 shows an example of the RAW original image data. In FIG. 17, the output from the image capturing element 100 having the pattern illustrated in FIG. 11 (A-1) is illustrated. The RAW image original data of FIG. 17 is made up of R pixels having a pixel value of color R, B pixels having a pixel value of color B, and Gb pixels and Gr pixels having pixel values resulting from multiplexing color G and parallax information. The RAW image original data may be generated by capturing images of the same scene at the same time.

Next, the image generating section 232 separates the pixels of the RAW original image data, into a RAW primary color image data group 302 made of pixels having the pixel values of the primary colors and a RAW parallax image data group 304 made of the pixels having the pixel values of the parallaxes (S12). For example in FIG. 17, the image generating section 232 generates R0 image data by extracting R pixels from the RAW original image data Hem the RAW original image data contains a pixel that does not have any color R pixel value (e.g., B pixel), and therefore the R0 image data lacks the pixel value of the pixel corresponding to the B pixel. Likewise, the image generating section 232 generates B0 image data by extracting B pixels from the RAW original image data.

The image generating section 232 generates G0 image data by extracting Gb pixels and Gr pixels from the RAW original image data. Here, Gb pixels contains a pixel value in which the information showing the color G and the information showing the parallax of Lt are multiplexed. Here, in an example, the image generating section 232 generates the G0 pixel data using the pixel value of the Gb pixel and the pixel value of the Gr pixel as the information of the color G in these pixels. In another example, the G0 image data may be generated by correcting the pixel value of the Gb pixel by referring to the pixel value of the pixel surrounding the Gb pixel, however it is desirable that the correction be reversible so that the information will not be deteriorated. Likewise, the image generating section 232 generates Lt image data by extracting the Gb pixel from the RAW original image data, and generates the Rt image by extracting the Gr pixel.

In this manner, the R0 image data, the G0 image data, and the B0 image data corresponding to the three primary colors R, G, and B, as well as the Lt0 image data and the Rt0 image data corresponding to the two parallaxes in the X axis direction are generated. Here, the combination of the R0 image data, the G0 image data, and the B0 image data is an example of the RAW primary image data group 302, and the combination of the Lt0 image data and the Rt0 image data is an example of the RAW parallax image data group 304. The RAW image data group 300 is made by the RAW primary color image data group 302 and the RAW parallax image data group 304.

The image generating section 232 interpolates pixel values in the pixels that do not have any pixel value in the above-described RAW primary color image data group 302 and RAW parallax image data group 304 (S14).

FIG. 18 shows an example of interpolation of pixel values in Step S14. In FIG. 18, the pixel values that do not have any pixel value are interpolated using the pixel values of the pixels in the R0 image data that have pixel values. For example, the pixel values of the pixels closest in the X axis direction, the Y axis direction, and in the X axis direction and the Y axis direction are averaged to generate a pixel value used in interpolation. In another example, it is also possible to calculate a weighted average of the pixels that are not the closest pixel, or refer to the pixel of different RAW primary color image data. So-called demosaicing may also be used.

Figure 19:
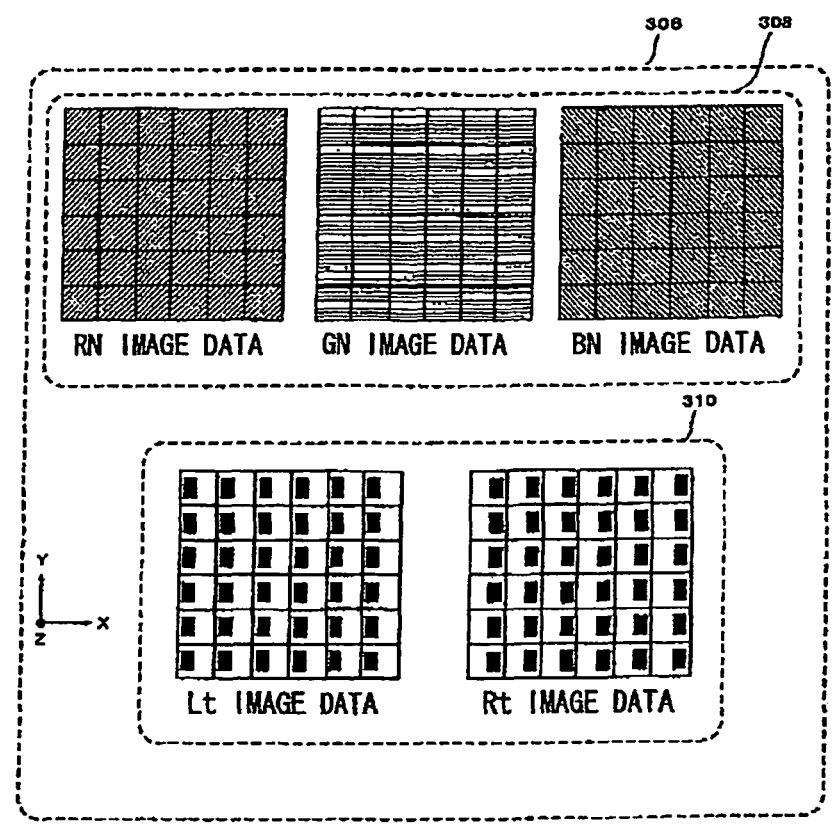
FIG. 19 shows a new RAW image data set 306.

FIG. 19 shows a new RAW image data set 306. By performing the above-described operation, the image generating section 232 interpolates the pixel value of the primary color for the pixel of the RAW original image data that does not have the pixel value of a primary color, thereby generating the RAW primary color image data group 308 corresponding to a plurality of primary colors constituting a color, as shown in FIG. 19. Likewise, the image generating section 232 interpolates the parallax pixel value for the pixel of the RAW original image data that does not have the parallax pixel value, thereby generating the RAW parallax image data group 310 corresponding in number to the number of the parallaxes. The RAW primary color image data group 308 and the RAW parallax image data group 310 constitute the new RAW image data set 306.

The control section 201 determines whether generation of a new RAW image data set is requested by converting the RAW image data set 306 (S16). The conversion may be requested by firmware, or by a user. Whether there is a request or not is stored in the memory 203, and the control section 201 determines whether there is a request by referring to the memory 203.

When there is no conversion requested in Step S16 (S16: No), the storage control section 238 stores the RAW image data set 306 in the memory card 220 (S20). In this case, the storage control section 238 may name the entire RAW image data set 306 as a single file and store it.

Figure 20:
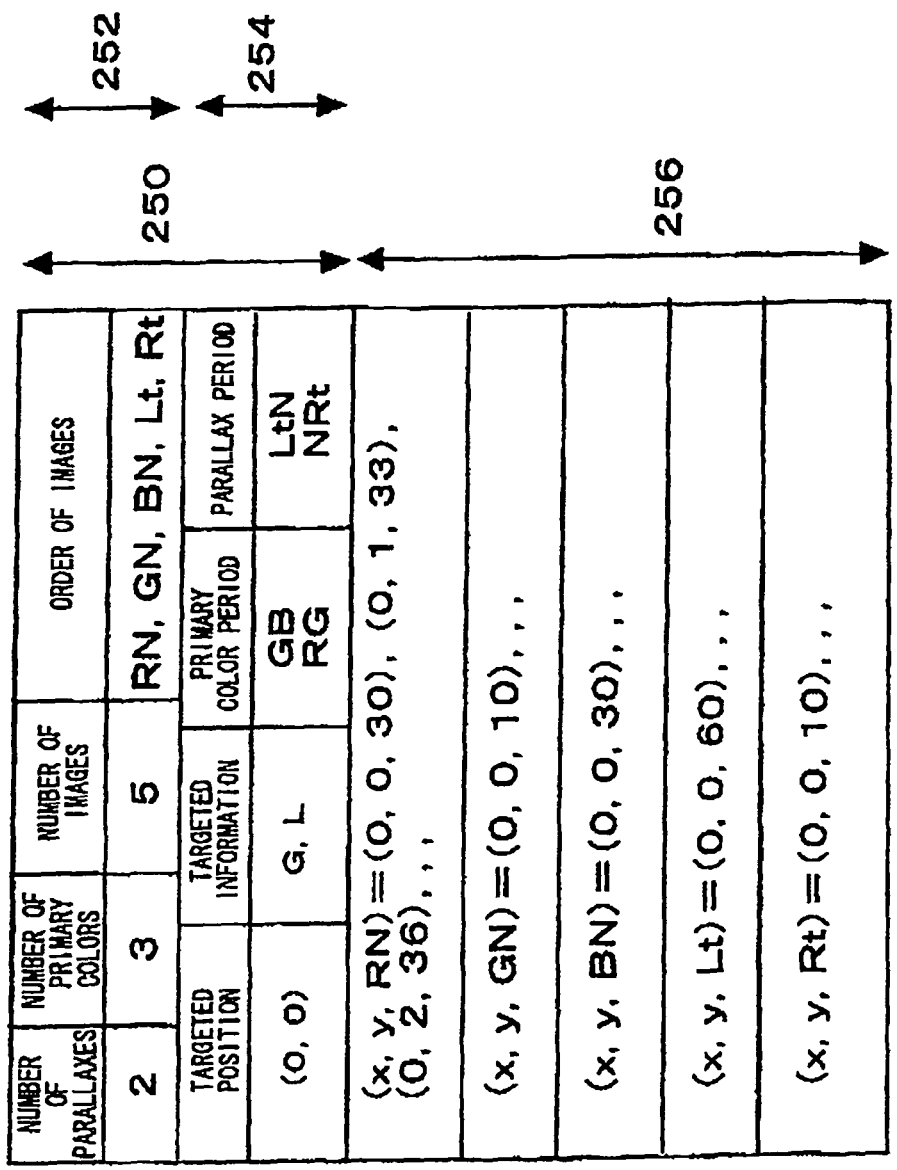
FIG. 20 schematically shows a data structure of a RAW image data set 306 stored by a storage control section 238.

FIG. 20 schematically shows a data structure of a RAW image data set 306 stored by a storage control section 238. The data in FIG. 20 contains a header 250 and a data main body 256. The header 250 contains data 252 of file information related to a file, and the data 254 of information identifying the repetitive pattern in the RAW original image data.

The information related to a file includes the number of parallaxes, the number of primary colors, the number of images in the set, and the order of description of the image data of the data main body 256. The example of FIG. 20 has the number of parallaxes "2", the number of primary colors "3", the number of images "5", and the order of the images "RN, GN, BN, Lt, Rt" in accordance with the example of FIG. 17 through FIG. 19.

The information identifying the repetitive pattern includes the target position which is the position of a certain targeted pixel selected from the pixels constituting the RAW original image data, the target information identifying the primary color and the parallax that the pixel value of the targeted pixel indicates, the primary color period which is the period of the array of the pixels that have the pixel values of the primary colors, and the parallax period of the array of the pixels that have the pixel values of the parallaxes. The example of FIG. 20 has (0, 0) as the target position. In addition, the primary color information "G" and the parallax information "Lt" are written in as the target information corresponding to the example of FIG. 17. The primary color periods "GB" and one row lower "RG", and the parallax periods "LtN" and one row lower "NRt" are written in. From the above, the information of the primary color of the pixel in the position "2, 0" of the RAW original image data is determined to be "G," because the primary color information of the pixel (0, 0) is "0" and the array period of the primary color of the y=0 is "GB". In this way, the information identifying the repetitive pattern helps identify the primary color and the parallax of the pixel value of the pixel in any position (n, m) in the RAW original image data.

Note that the information identifying the repetitive pattern is not limited to the information shown in FIG. 20. It is also possible to identify the repetitive pattern of the RAW original image data, by assigning each repetitive pattern an ID, and writing the ID into the header.

The data main body of FIG. 20 stores a pixel value in association with the position of the pixel for five pieces of image data. The method of storing the data is not limited to the one shown in FIG. 20. In another example, the data may be stored after being compressed such as using an encoding technique. It is preferable that this compression is reversible.

In addition, the data as a whole in FIG. 20 may be an individual format that does not depend on a display apparatus. In other words, when displayed, the data may postulate that the development is based on the development program. Therefore, the data of FIG. 20 can be interpreted as intermediate data because it is after the provision of such processing as interpolation to the RAW original image data obtained from the A/D converter 202, however it is before undergoing the compression conversion to a general format such as JPEG to be performed by the development program.

When the conversion of the image data is requested in Step S16 of FIG. 16 (S16: YES), the image converting section 233 converts the RAW image data set 306 into another RAW image data set (S18). An example of this another RAW image data set is a combination of image data in which a single piece of data is made up of pixels having pixel values of a single parallax and a single primary color. The following takes the RLt image data that is made up of pixels in which the pixel value of a single pixel is made up of a pixel showing the primary color R and the parallax Lt for the primary colors of RGB and LtRt parallax.

Figure 21:
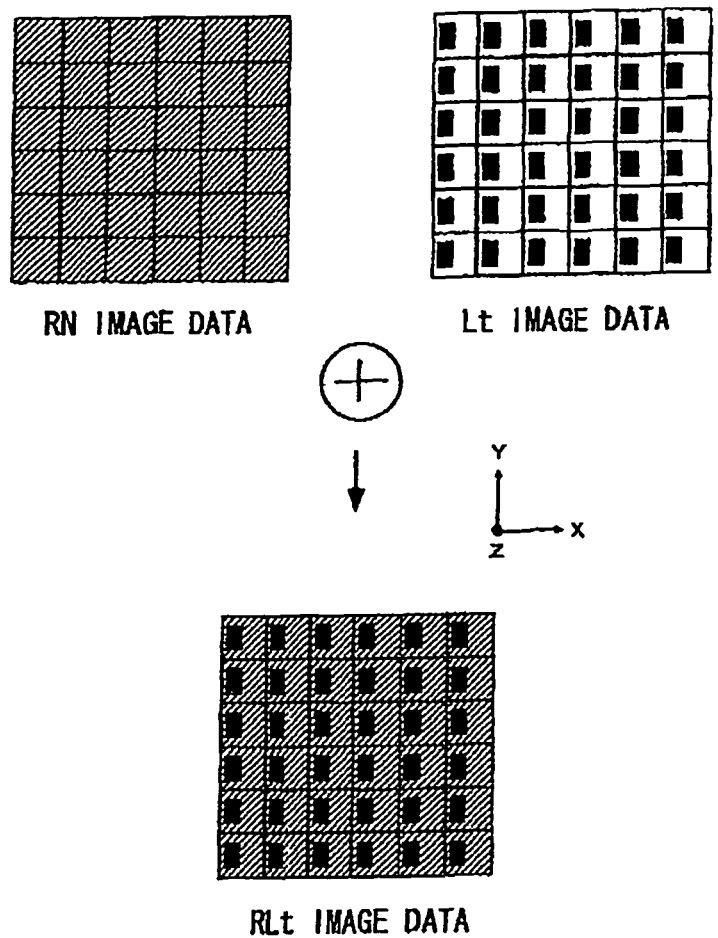
FIG. 21 shows an example of conversion to RLt image data.

FIG. 21 shows an example of conversion to RLt image data. In FIG. 21, the RLt image data is generated from the RN image data and the Lt image data of the RAW image data set 306 of FIG. 19. In this case, the operation value of the pixel value of the pixel of the RN image data and the pixel value of the pixel in the same position in the Lt image data is used as the pixel value of the pixel in the position corresponding to the RLt image data. Other operations may also be used.

Figure 22:
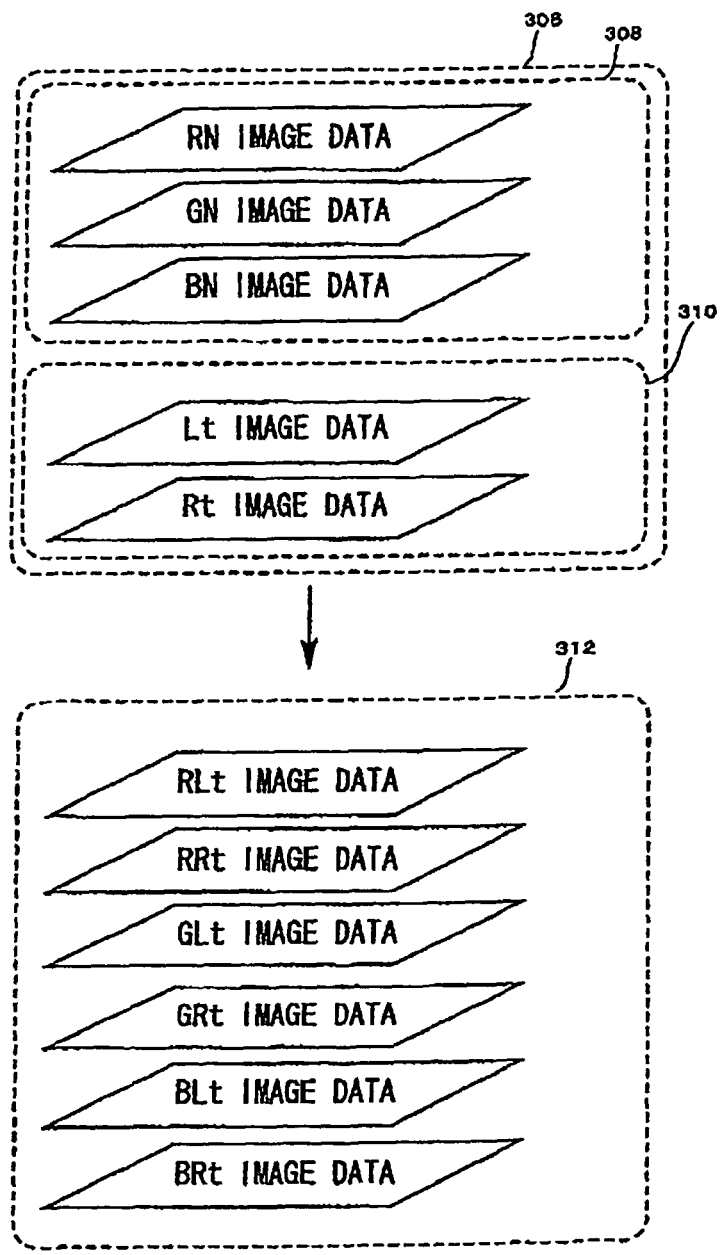
FIG. 22 shows a new RAW image data set 312.

A combination of image data in number corresponding to the number of the primary colors multiplied by the number of the parallaxes are generated by performing the similar conversions. The conversion enables to generate a new RAW image data set 312 from the RAW image data set 306, as shown in FIG. 22.

The new RAW image data set 312 is stored in the memory card 220 by the storage control section 238 as a single file using the data structure as shown in FIG. 20 for example (S20). The flowchart ends here.

As explained so far, according to the embodiment from FIG. 16 to FIG. 22, the succeeding image data processing can be made easier because the embodiment allows separation of the RAW original image data in which the information of the primary colors and the information of the parallaxes are multiplexed depending on the repetitive pattern of the Image capturing element 100, into pieces of RAW image data separated for information of each primary color and information of each parallax. When the processing is reversible, the deterioration of an image can be alleviated also for the RAW image data set after separation. Note that the operation of FIG. 16 may be stored in a program memory of the digital camera 10 as a firmware program, and be executed in response to reading of this program.

In the flowchart shown in FIG. 16, the pixel value is interpolated in Step S14. However, this step may be omitted and the control may directly go to Step S20. In this case, the RAW image data set 300 shown in FIG. 17 is stored in the memory card 220.

Figure 23:
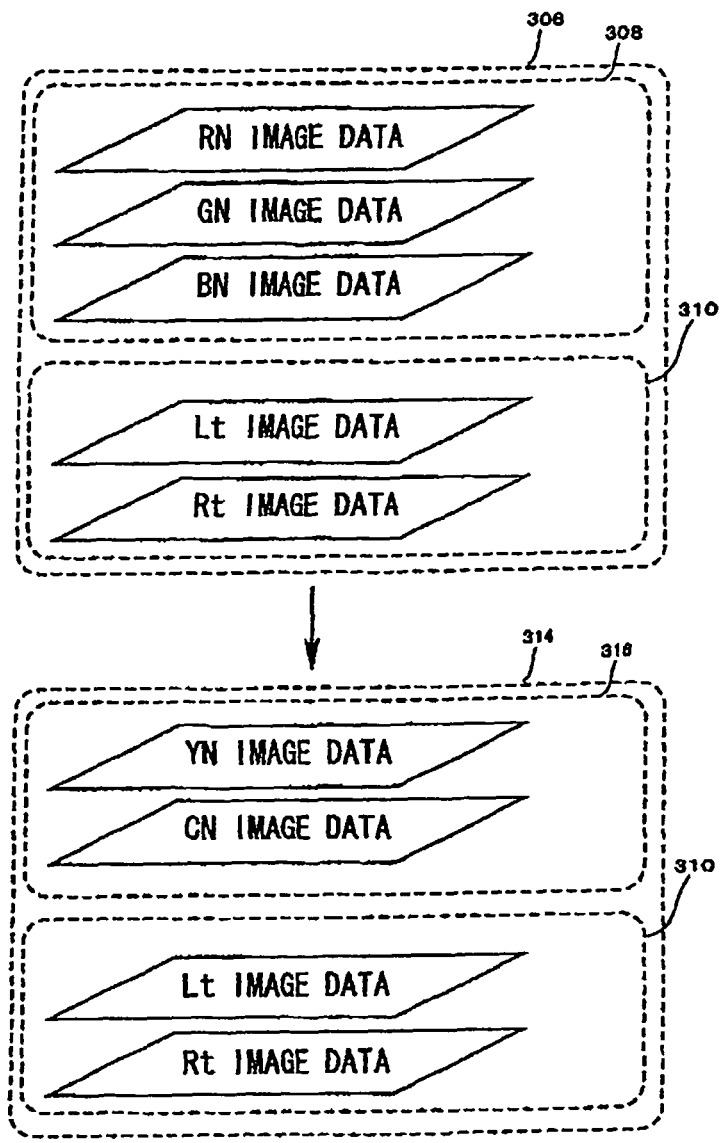
FIG. 23 shows another RAW image data set 314 generated in Step S18.

FIG. 23 shows another RAW image data set 314 generated in Step S18. The RAW image data set 314 of FIG. 23 includes YN image data showing brightness and CN image data showing the color difference, as the RAWYC image data group 316. The YN image data and the CN image data are obtained by converting the pixel values of the RGB of the pixels in the same position in the RAW primary image data group 308 into the pixel values of the YC. For example, the RGB is converted into YCrCb as Y=0.3R+0.59G+0.11B, CR=R−Y, Cb=B−Y. The value of Y is used as the pixel value of the YN image data, and the values of Cr and Cb are used as the pixel value of the CN image data. Therefore, one pixel of the CN image data will be a two-dimensional value of (Cr, Cb).

According to the RAW image data set 314 of FIG. 23, the amount of data can be lessened compared to a case in which the RGB system is used. Furthermore, since data compression to the brightness Y and the color difference C can be controlled independent from each other, the freedom of control for the amount of data can be enhanced. Note that in the above-described embodiment example, the YN image data and the CN image data are generated from the RAW primary color image data group 308. However, YN image data and CN image data may be generated from the RAW primary image data group 302 of FIG. 17, instead.

The image converting section 233 may further generate, from the RAWYC image data group 316 and RAW parallax image data group 310 of FIG. 23, YLt image data in which the pixel value of each pixel indicates the brightness Y and the parallax Lt, the YRt image data in which the pixel value of each pixel indicates the brightness Y and the parallax Rt, CLt image data in which the pixel value of each pixel indicates the color difference C and the parallax Lt, and CRt image data in which the pixel value of each pixel indicates the color difference C and the parallax Rt. By doing so, the RAW image data set in which the data amount is compressed in a greater degree than the RAW image data set 314 of FIG. 23 can be obtained. Note that this RAW image data set may be generated from the RAW image data set 306.

Figure 24:
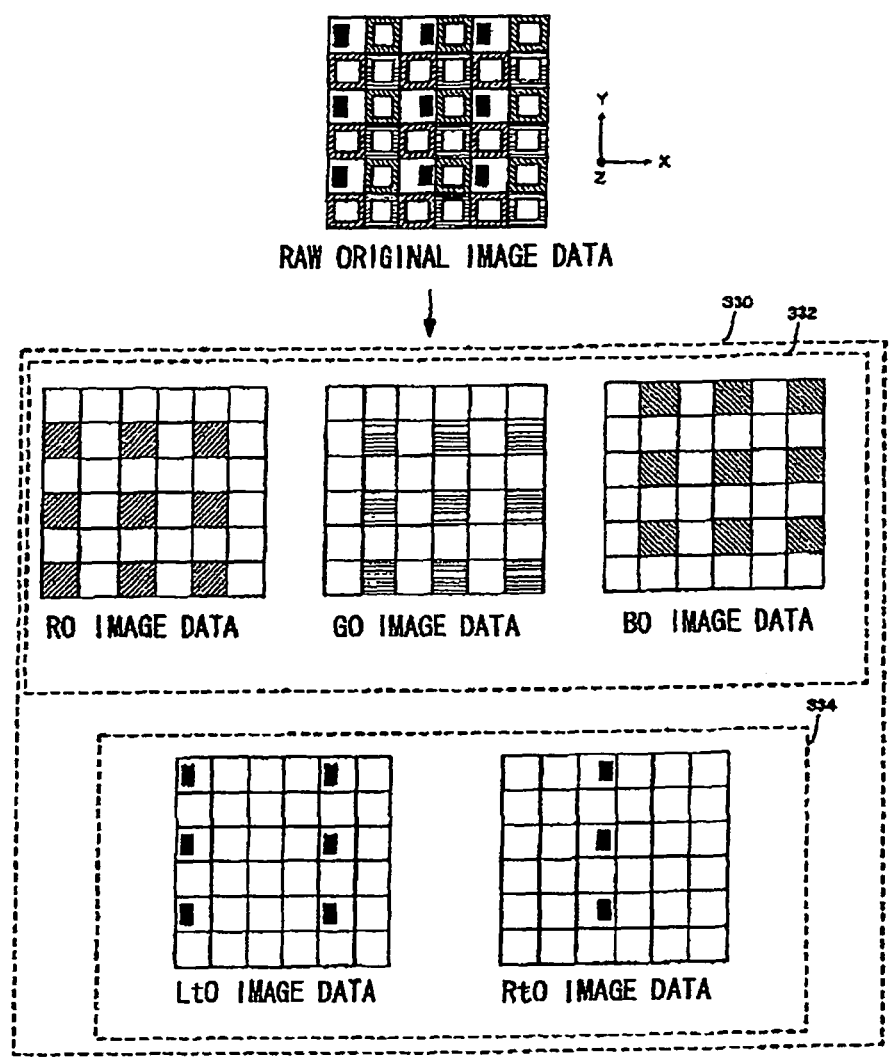
FIG. 24 shows a relation between RAW original image data and a RAW image data set 330 in another repetitive pattern.

FIG. 24 shows a relation between RAW original image data and a RAW image data set 330 in another repetitive pattern. FIG. 24 shows RAW original image data adopting the repetitive pattern (B'-1) of FIG. 15. Although each pixel of the RAW original image data of FIG. 24 is either the information of the primary color or the information of the parallax, the information of the primary color and the information of the parallax are multiplexed as the RAW original image data as a whole.

Just as shown in the example of FIG. 17 in Step S12, the RAW primary color image data group 332 and the RAW parallax image data group 334 are also generated for the RAW original image data of FIG. 24. It is also possible to generate a new RAW image data set by interpolating the pixels in Step S14.

Likewise, the RAW image data made of the RAW primary image data group and the RAW parallax image data group can be obtained from the RAW image data obtained by performing image capturing based on each repetitive pattern shown in FIG. 10. In particular, even when the number of parallaxes is more than 2, the similar operation can be performed to obtain the RAW primary color image data group and the RAW parallax image data group.

In the embodiment shown in FIG. 16 through FIG. 24, the storage control section 238 stores the RAW image data set as a single file, however the storage method is not limited to this. In another possible example, the storage control section 238 stores each image data group included in the RAW image data set as a single file. In this case, each file may be assigned header information as explained in FIG. 20. It is also possible to attach and store the file information and the repetitive pattern information shown in FIG. 20 as an attachment file that is different from the image data file, instead of adding the information to the header.

Figure 25:
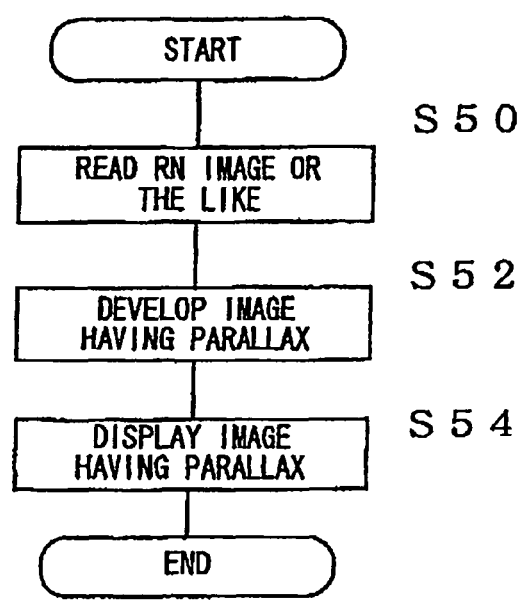
FIG. 25 is a flow chart showing an example using a RAW image data set 300 generated from FIG. 1 through FIG. 24.

FIG. 25 is a flow chart showing an example using a RAW image data set 300 or the like generated from FIG. 1 through FIG. 24. The flowchart of FIG. 25 is started in response to a request to display the image on a specific display apparatus from a user using a PC or the like.

First, in response to a user selection, the PC reads one RAW image data set 300 or the like having been copied on a hard disk or the like in advance (S50). For example, the user may select the RAW image data set 312, and so the RAW image data set 312 is read onto the PC.

Further, the PC develops the read RAW image data set 312 using a development program (S52), and displays it (S54). Suppose that the display apparatus enables stereoscopic views by displaying a right-eye image and a left-eye image, and each type of image data adopts the JPEG technique. Then, the PC generates a JPEG image for a right eye and a JPEG image for a left eye from the RAW image data set 312.

In this case, the PC may correct the JPEG images or add visual effects to the JPEG images, either automatically or in response to a user request. Even in such cases, because the original data is a RAW image data set that is similar to the RAW original image data obtained from the image capturing element, the resulting display image does not have much deterioration. Note that it is also possible to generate a primary color image data group and a parallax image data group using a method similar to the method shown in FIG. 1 through FIG. 24 and from the original image data generated from subjecting the data from the image capturing element 100 to non-reversible processing, instead of generating a primary color image data group and a parallax image data group by obtaining RAW original image data.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. An image processing apparatus comprising:
   an image processor programmed to execute instructions that cause the image processor to:
   obtain original image data from an image sensor that has pixels each containing a pixel value showing any of primary colors constituting colors of a subject image and showing a non-parallax of the subject image, and pixels each containing a pixel value showing any of the primary colors constituting the colors of the subject image and showing at least a parallax of the subject image,
   generate, by separating the pixels of the original image data, primary color image data based on the pixels each containing the respective pixel value showing the non-parallax of the subject image, and a plurality of parallax image data sets based on the pixels each containing the respective pixel value showing at least the respective parallax of the subject image, a number of the plurality of parallax image data sets corresponding to a number of parallaxes, and
   for each of the plurality of image data sets, interpolate the pixel values of the pixels each containing the respective pixel value showing the non-parallax of the subject image using the pixel values of the pixels each containing the respective pixel value showing at least the respective parallax of the subject image to generate a combination of parallax image data, wherein a number of sets of combined parallax image data in the generated combination corresponds to the number of parallaxes.

2. The image processing apparatus according to claim 1, wherein the image processor is further programmed to execute instructions that cause the image processor to, for pixels forming the original image data that contain the pixel value showing the parallax of the subject image, interpolate the pixel value showing the primary color to generate a combination of primary image data corresponding in number to a number of the primary colors constituting the colors.

3. The image processing apparatus according to claim 1, wherein the image processor is further programmed to execute instructions that cause the image processor to generate the primary color image data and the combined parallax image data by including performance of a reversible operation on the original image data.

4. The image processing apparatus according to claim 1, further comprising a memory, wherein the image processor is further programmed to execute instructions that cause the image processor to store the primary color image data and the combined parallax image data in the memory.

5. The image processing apparatus according to claim 4, wherein the image processor is further programmed to execute instructions that cause the image processor to store the primary color image data and the combined parallax image data as a single file in the memory.

6. The image processing apparatus according to claim 5, wherein the image processor is further programmed to execute instructions that cause the image processor to store additional information assigned to the single file in the memory, the additional information including information regarding one of the pixels forming the original image data associated with information indicated by the pixel value of the one of the pixels.

7. The image processing apparatus according to claim 6, wherein the image processor is further programmed to execute instructions that cause the image processor to store, as the additional information in the memory, information identifying a position of a specific targeted pixel, information identifying a primary color and a parallax indicated by a pixel value of the targeted pixel, a period of an array of pixels having pixel values of the primary colors, and a period of an array of pixels having pixel values of parallaxes.

8. The image processing apparatus according to claim 1, wherein the image processor is further programmed to execute instructions that cause the image processor to generate parallax primary color image data obtained from pixels having a pixel value of any one primary color for any one parallax based on pixel values of pixels in a combination of the primary color image data corresponding to the primary colors constituting the colors and pixel values of pixels in a combination of the parallax image data corresponding to a plurality of types of parallax information corresponding in number to the number of parallaxes, in a combination corresponding in number to the number of parallaxes and the number of the primary colors.

9. The image processing apparatus according to claim 8, further comprising a memory, wherein the image processor is further programmed to execute instructions that cause the image processor to store the combination of parallax primary color image data in the memory.

10. The image processing apparatus according to claim 9, wherein the image processor is further programmed to execute instructions that cause the image processor to store the combination of the parallax primary color image data as a single file in the memory.

11. The image processing apparatus according to claim 10, the image processor is further programmed to execute instructions that cause the image processor to store additional information assigned to the single file in the memory, the additional information including information regarding one of the pixels forming the original image data associated with information indicated by the pixel value of the one of the pixels.

12. The image processing apparatus according to claim 11, wherein the image processor is further programmed to execute instructions that cause the image processor to store in the memory, as the additional information, information identifying a position of a specific targeted pixel, information identifying a primary color and a parallax indicated by a pixel value of the targeted pixel, a period of an array of pixels having pixel values of the primary colors, and a period of an array of pixels having pixel values of parallaxes.

13. The image processing apparatus according to claim 1, wherein the image processor is further programmed to execute instructions that cause the image processor to generate brightness image data and color difference image data by converting pixel values of pixels in a combination of the primary color image data corresponding to a plurality of pieces of primary color information constituting colors to pixel values showing brightness information and pixel values showing color difference information.

14. The image processing apparatus according to claim 13, further comprising a memory, wherein the image processor is further programmed to execute instructions that cause the image processor to store the brightness image data, the color difference image data, and the combined parallax image data in the memory.

15. The image processing apparatus according to claim 14, wherein the image processor is further programmed to execute instructions that cause the image processor to store the brightness image data, the color difference image data, and the combined parallax image data as a single file in the memory.

16. The image processing apparatus according to claim 15, wherein the image processor is further programmed to execute instructions that cause the image processor to store additional information assigned to the single file in the memory, the additional information including information regarding one of the pixels forming the original image data associated with information indicated by the pixel value of the one of the pixels.

17. The image processing apparatus according to claim 16, wherein the image processor is further programmed to execute instructions that cause the image processor to store in the memory, as the additional information, information identifying a position of a specific targeted pixel, information identifying a primary color and a parallax indicated by a pixel value of the targeted pixel, a period of an array of pixels having pixel values of the primary colors, and a period of an array of pixels having pixel values of parallaxes.

18. The image processing apparatus according to claim 1, wherein the image processor is further programmed to execute instructions that cause the image processor to obtain RAW image data resulting from subjecting the original image data to reversible image processing, the original image data being image data obtained from an image capturing element.

19. An image processing method comprising:
obtaining original image data from an image sensor that has pixels each containing a pixel value showing any of primary colors constituting colors of a subject image and showing a non-parallax of the subject image, and pixels each containing a pixel value showing any of the primary colors constituting the colors of the subject image and showing at least a parallax of the subject image,
generating, by separating the pixels of the original image data, primary color image data based on the pixels each containing the respective pixel value showing the non-parallax of the subject image, and a plurality of parallax image data sets based on the pixels each containing the respective pixel value showing at least the respective parallax of the subject image, a number of the plurality of parallax image data sets corresponding to a number of parallaxes, and
for each of the plurality of parallax image data sets, interpolating the pixel values of the pixels each containing the respective pixel value showing the non-parallax of the subject image using the pixel values of the pixels each containing the respective pixel value showing at least the parallax of the subject image to generate a combination of parallax image data, wherein a number of sets of combined parallax image data in the generated combination corresponds to the number of parallaxes.

20. A non-transitory computer-readable recording medium storing therein a program including computer executable instructions, that, when executed, cause an image processor to:
obtain original image data from an image sensor that has pixels each containing a pixel value showing any of primary colors constituting colors of a subject image and showing a non-parallax of the subject image, and pixels each containing a pixel value showing any of the primary colors constituting the colors of the subject image and showing at least a parallax of the subject image;
generate, by separating the pixels of the original image data, primary color image data based on the pixels each containing the respective pixel value showing the non-parallax of the subject image, and a plurality of parallax image data sets based on the pixels each containing the respective pixel value showing at least the respective parallax of the subject image, a number of the plurality of parallax image data sets corresponding to a number of parallaxes, and
for each of the plurality of parallax image data sets, interpolating the pixel values of the pixels each containing the respective pixel value showing the non-parallax of the subject image using the pixel values of the pixels each containing the respective pixel value showing at least the respective parallax of the subject image to generate a combination of parallax image data, wherein a number of sets of combined parallax image data in the generated combination corresponds to the number of parallaxes.

21. An image processing apparatus comprising:
an image processor programmed to execute instructions that cause the image processor to:
   obtain original image data from an image sensor that has at least four pixels including at least two primary color pixels that each contain a pixel value showing any of primary colors constituting colors of a subject image and showing a non-parallax of the subject image, and at least two parallax pixels that each contain a pixel value showing any of the primary colors constituting the colors of the subject image and showing at least a parallax of the subject image,
   generate, by separating the pixels of the original image data, primary color image data based on the pixels each containing the respective pixel value showing any of the primary colors, and a plurality of parallax image data sets based on the pixels each containing the respective pixel value showing at least the respective parallax of the subject image, a number of the plurality of parallax image data sets corresponding to a number of parallaxes, and
   for each of the plurality of parallax image data sets, interpolate the pixel value of the pixels each containing the respective pixel value showing the non-parallax of the subject image using the pixel values of the pixels each containing the respective pixel value showing at least the respective parallax of the subject image to generate a combination of parallax image data, wherein a number of sets of combined parallax image data in the generated combination corresponds to the number of parallaxes.

* * * * *